United States Patent
Lee et al.

(10) Patent No.: US 11,452,206 B2
(45) Date of Patent: Sep. 20, 2022

(54) CARD-TYPE SOLID STATE DRIVE

(71) Applicant: SAMSUNG ELECTRONICS CO., LTD., Suwon-si (KR)

(72) Inventors: In-Jae Lee, Seoul (KR); Youngdong Kim, Hwaseong-si (KR); Sang Sub Song, Suwon-si (KR); Ki-Hong Jeong, Jeonju-Si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 17/029,222

(22) Filed: Sep. 23, 2020

(65) Prior Publication Data

US 2021/0212206 A1 Jul. 8, 2021

(30) Foreign Application Priority Data

Jan. 7, 2020 (KR) .................. 10-2020-0001866

(51) Int. Cl.
*H05K 1/00* (2006.01)
*H05K 1/11* (2006.01)
*H01R 12/71* (2011.01)

(52) U.S. Cl.
CPC ........... *H05K 1/117* (2013.01); *H01R 12/714* (2013.01); *H05K 2201/094* (2013.01); *H05K 2201/09409* (2013.01); *H05K 2201/10159* (2013.01)

(58) Field of Classification Search
CPC ............. H05K 1/117; H05K 2201/094; H05K 2201/09409; H05K 2201/1015; H01R 12/714
See application file for complete search history.

(56) References Cited

U.S. PATENT DOCUMENTS

| | | |
|---|---|---|
| 7,291,903 B2 | 11/2007 | Nishizawa et al. |
| 7,800,138 B2 | 9/2010 | Baek et al. |
| 8,070,067 B2 | 12/2011 | Liu |
| 8,838,885 B2 | 9/2014 | Kwak et al. |
| 9,047,547 B2 | 6/2015 | Okada |
| 9,237,157 B2 | 1/2016 | Zhang et al. |

(Continued)

FOREIGN PATENT DOCUMENTS

| | | |
|---|---|---|
| KR | 10-2011-0125758 | 11/2011 |
| KR | 10-2012-0137051 | 12/2012 |

(Continued)

*Primary Examiner* — Pete T Lee
(74) *Attorney, Agent, or Firm* — F. Chau & Associates, LLC

(57) ABSTRACT

A card-type solid state drive (SSD) including: a substrate that has a first surface and a second surface facing each other; a memory controller and a nonvolatile memory device that are on the first surface; a plurality of functional terminals on the second surface; and a plurality of thermal terminals on the second surface, wherein the functional terminals include first-row functional terminals, second-row functional terminals, and third-row functional terminals, wherein at least one of the first-row functional terminals, at least one of the second-row functional terminals, and at least one of the third-row functional terminals are electrically connected to the memory controller or the nonvolatile memory device, and wherein the thermal terminals are not electrically connected to the memory controller or the nonvolatile memory device.

19 Claims, 21 Drawing Sheets

(56) References Cited

U.S. PATENT DOCUMENTS

| | | | |
|---|---|---|---|
| 9,293,854 | B2 | 3/2016 | Kang et al. |
| 9,620,875 | B2 | 4/2017 | Kim et al. |
| 10,347,345 | B2 | 7/2019 | Han et al. |
| 10,374,342 | B2 | 8/2019 | Koh et al. |
| 10,403,329 | B2 | 9/2019 | Han et al. |
| 10,714,853 | B2 * | 7/2020 | Saito .................... H05K 5/0247 |
| 2009/0057880 | A1 * | 3/2009 | Baek ................... H01L 25/0657 |
| | | | 257/713 |
| 2019/0182954 | A1 | 6/2019 | Sirajudeen et al. |
| 2021/0103791 | A1 | 4/2021 | Lee et al. |

FOREIGN PATENT DOCUMENTS

| | | |
|---|---|---|
| KR | 10-1361828 | 2/2014 |
| KR | 10-1881403 | 7/2018 |
| KR | 10-2021-0039892 | 4/2021 |
| WO | 2018225327 | 12/2018 |

\* cited by examiner

CARD-TYPE SOLID STATE DRIVE

CROSS-REFERENCE TO RELATED APPLICATION

This U.S. nonprovisional application claims priority under 35 U.S.C § 119 to Korean Patent Application No. 10-2020-0001866 filed on Jan. 7, 2020 in the Korean Intellectual Property Office, the disclosure of which is incorporated by reference herein in its entirety.

Technical Field

Exemplary embodiments of the present inventive concept relate to a card-type solid state drive.

Discussion of Related Art

A memory card is an electronic data storage device used for storing digital information. A memory card is widely used in electronic apparatuses such as mobile phones and laptop computers. A memory and may have various sizes depending on its application. Over time, a memory card has been made smaller, faster and with a larger storage capacity. A high capacity memory for use in a compact-sized memory card may use a method to stably provide power and support high operating speeds.

SUMMARY

According to exemplary embodiments of the present inventive concept, there is provided a card-type solid state drive (SSD) including: a substrate that has a first surface and a second surface facing each other; a memory controller and a nonvolatile memory device that are on the first surface; a plurality of functional terminals on the second surface: and a plurality of thermal terminals on the second surface, wherein the functional terminals include first-row functional terminals, second-row functional terminals, and third-row functional terminals, wherein at least one of the first-row functional terminals, at least one of the second-row functional terminals, and at least one of the third-row functional terminals are electrically connected to the memory controller or the nonvolatile memory device, and wherein the thermal terminals are not electrically connected to the memory controller or the nonvolatile memory device.

According to exemplary embodiments of the present inventive concept, there is provided a card-type SSD including: a substrate that includes an insertion edge, a first edge, and a second edge, the insertion edge extending in a first direction, the first and second edges being adjacent to the insertion edge and extending, in a second direction perpendicular to the first direction; a protrusion at the first edge; and first-row functional terminals, second-row functional terminals, third-row functional terminals, and thermal terminals that are on a surface of the substrate, wherein the first-row functional terminals are linearly arranged along the first direction, the first-row functional terminals including a first power terminal and a plurality of first data terminals, wherein the second-row functional terminals are spaced apart in the second direction from the first-row functional terminals and are linearly arranged along the first direction, the second-row functional terminals including a second power terminal and a plurality of second data terminals, wherein the third-row functional terminals are spaced apart in the second direction from the second-row functional terminals and are linearly arranged along the first direction, the third-row functional terminals including a third power terminal and a plurality of command terminals, wherein the thermal terminals are arranged in at least one row and are spaced apart in the second direction from the first-row functional terminals, the second-row functional terminals, and the third-row functional terminals, wherein the first, second, and third power terminals are adjacent to the first edge, and wherein one of the thermal terminals that is adjacent to the first edge is not linearly arranged along the second direction with the first, second, or third power terminal.

According to exemplary embodiments of the present inventive concept, there is provided a card-type SSD including: a substrate that has a first surface and a second surface facing each other; a memory controller and a nonvolatile memory device that are on the first surface; a plurality of functional terminals on the second surface; and a plurality of thermal terminals on the second surface, wherein the functional terminals include first-row functional terminals including a first power terminal, second-row functional terminals, including a second power terminal, and third-row functional terminals including a third power terminal adjacent to a first edge of the card-type SSD, wherein a thermal terminal closest to the first edge is farther from the first edge than each of the first, second and third power terminals.

DETAILED DESCRIPTION OF THE EMBODIMENTS

Hereinafter, exemplary embodiments of the present inventive concept will now be described in detail with reference to the accompanying drawings.

Figure 1A:
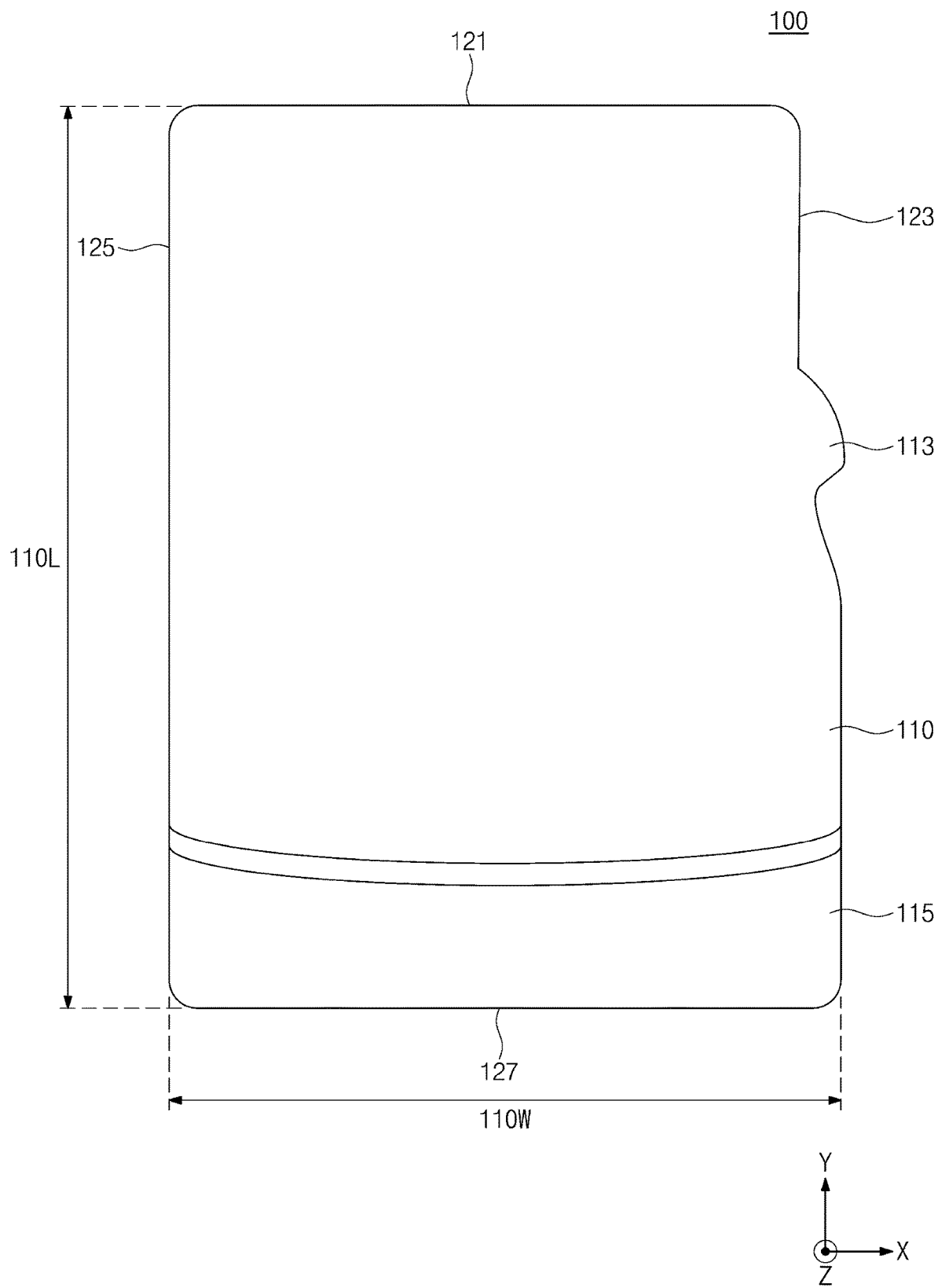
FIG. 1A illustrates a simplified top, view showing a card-type solid state drive according to exemplary embodiments of the present inventive concept.
Figure 1B:
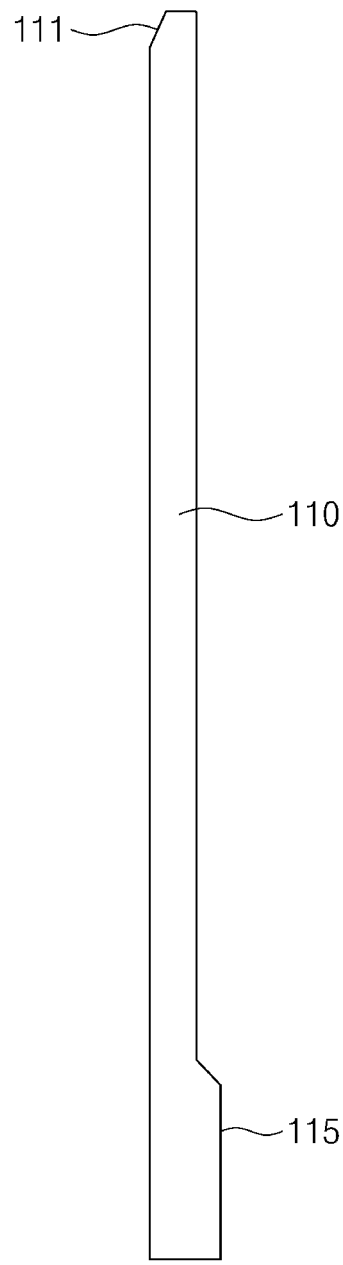
FIG. 1B illustrates a simplified side view sowing a card-type solid state drive according to exemplary embodiments of the present inventive concept.
Figure 1C:
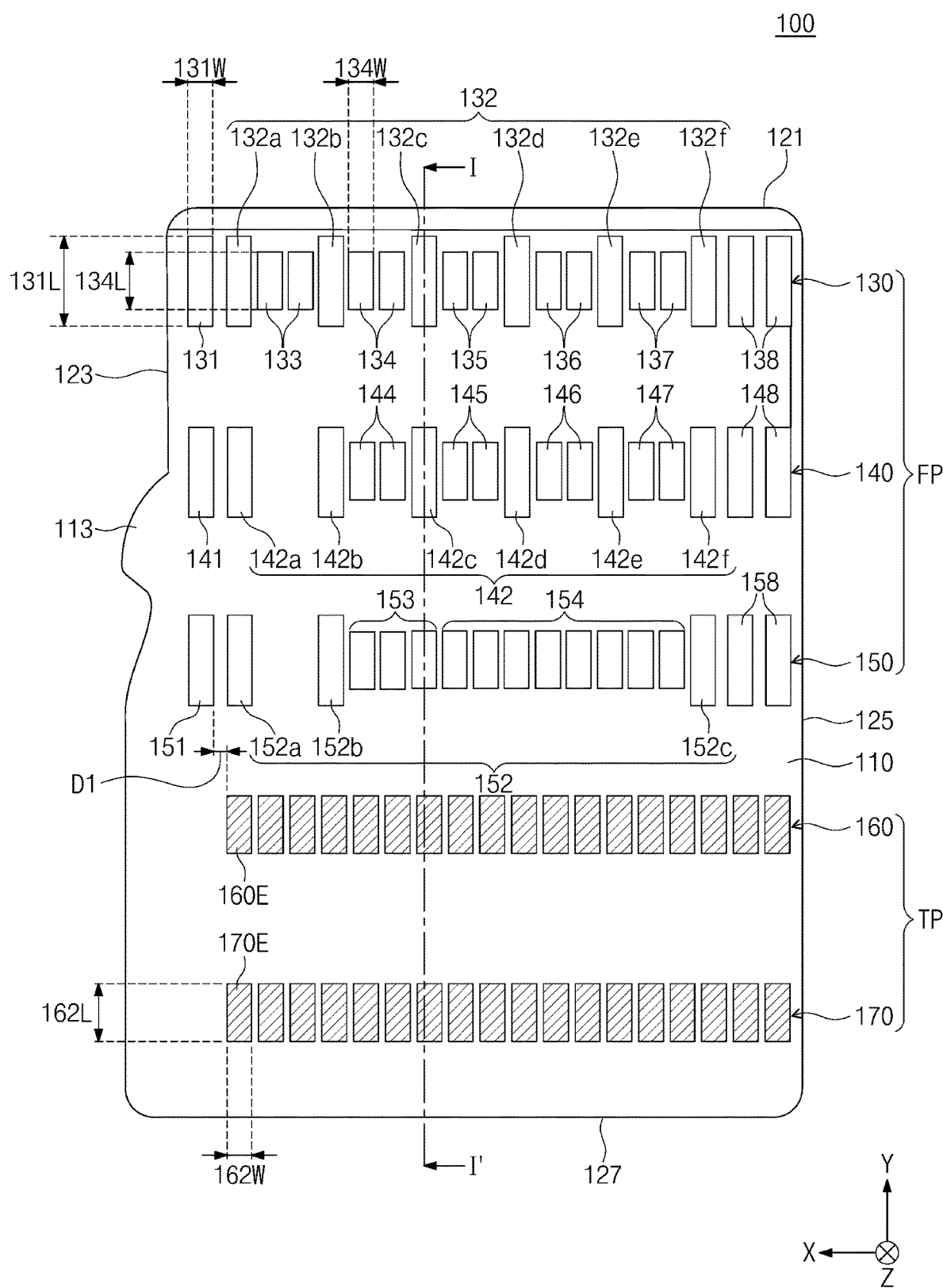
FIG. 1C illustrates a bottom view showing a card-type solid state drive according to exemplary embodiments of the present inventive concept.
Figure 1D:
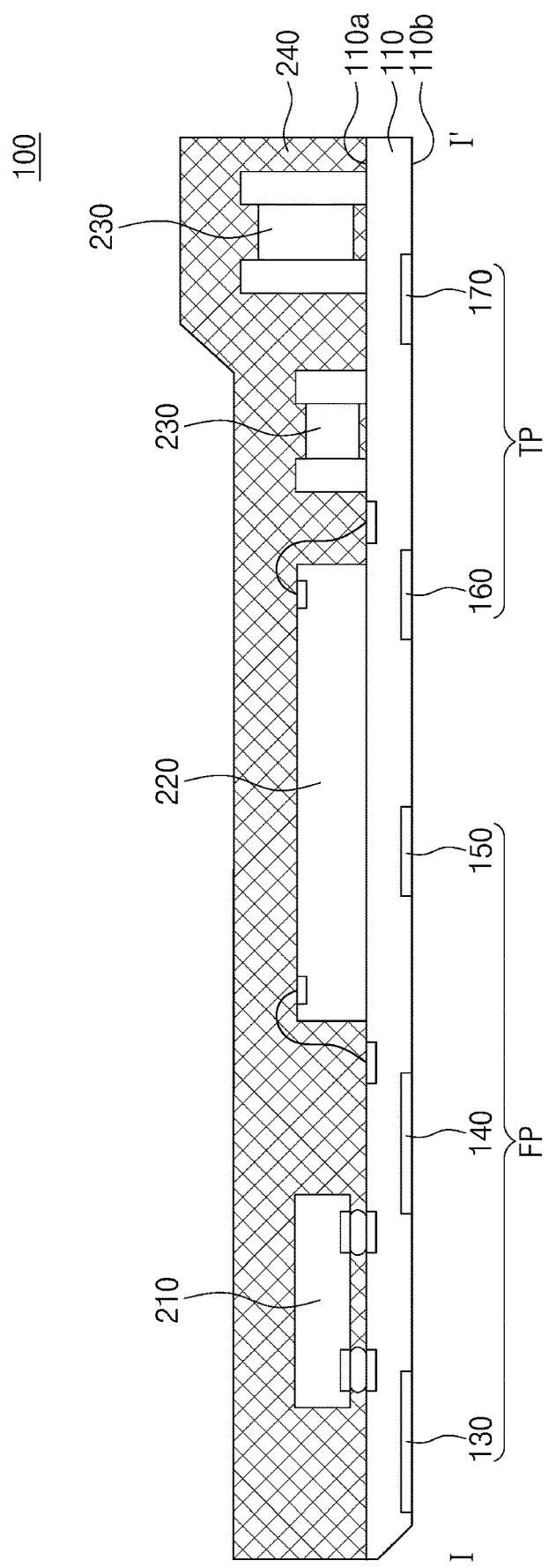
FIG. 1D illustrates a cross-sectional view taken along line I-I' of FIG. 1C.

FIG. 1A illustrates a simplified top view showing a card-type solid state drive according to exemplary embodiments of the present inventive concept. FIG. 1B illustrates a simplified side view sowing a card-type solid state drive according to exemplary embodiments of the present inventive concept. FIG. 1C illustrates a bottom view showing a card-type solid state drive according to exemplary embodiments of the present inventive concept. FIG. 1D illustrates a cross-sectional view taken along line I-I' of FIG. 1C.

Referring to FIGS. 1A to 1D, a card-type solid state drive (SSD) 100 may include a substrate 110 including a first surface 110a and a second surface 110b opposite to each other, a memory controller 210, a nonvolatile memory device 220, functional terminals FP, thermal terminals TP, passive devices 230, power management devices, and a molding member 240.

The substrate 110 may be, for example, a printed circuit board (PCB) with signal patterns. The memory controller 210, the nonvolatile memory device 220, the passive devices 230, and the power management devices may be mounted on the first surface 110a of the substrate 110. The nonvolatile memory device 220 may be, for example, a NAND Flash memory. However, the nonvolatile memory device 220 is not limited thereto and may be, for example, a ferroelectric random access memory. The passive device 230 may be one of a resistor, a capacitor, and an inductor. The power management devices may include a low drop out regulator (LDO) and a direct current (DC)-DC converter.

The memory controller 210 may be, for example, flip-chip mounted on the first surface 110a. Alternatively, the memory controller 210 may be mounted on the first surface 110a in a wire bonding manner. The nonvolatile memory device 220 may be, for example, wire-bond mounted on the first surface 110a. Alternatively, the nonvolatile memory device 220 may be mounted on the first surface 110a in a flip-chip bonding manner.

The functional terminals FP and the thermal terminals TP may be provided on the second surface 110b of the substrate 110. For example, the functional terminals FP and the thermal terminals TP may face the memory controller 210, nonvolatile memory device 220 and passive devices 230. The functional terminals FP may include first-row functional terminals 130, second-row functional terminals 140, and third-row functional terminals 150. The thermal terminals TP may be arranged in at least one row. The thermal terminals TP may include first-row thermal terminals 160 and second-row thermal terminals 170.

The functional terminals FP and the thermal terminals TP will be further discussed in detail below.

The substrate 110 of the card-type SSD 100 may have a width 110W of about 20 mm in a first direction X and a length 110L, of about 24 mm in a second direction Y, but the present inventive concept is not limited thereto.

The card-type SSD 100 may have two pairs of edges that face each other. The two pairs of facing edges may have an insertion edge 121 disposed in a direction along which the card-type SSD 100 is inserted into a socket, and also have a first edge 123 and a second edge 125 that neighbor the insertion edge 121. In addition, the card-type SSD 100 may have a withdrawal edge 127 opposite to the insertion edge 121. The insertion edge 121 is the portion of the card-type SSD 100 that is first inserted into the socket and the withdrawal edge 127 is the portion of the card-type SSD 100 grasped by a user to remove the card-type SSD 100 from the socket.

The second edge 125 may extend in the second direction Y perpendicular to the first direction X along which the insertion edge 121 extends. In addition, the second edge 125 may extend along only one direction. For example, the second edge 125 may be straight. Alternatively, the first edge 123 may have both a portion parallel to the second edge 125 and a portion non-parallel to the second edge 125.

In exemplary embodiments of the present inventive concept, the card-type SSD 100 may include a chamfer 111. The chamfer 111 may prevent connection pins from being damaged when the card-type SSD 100 is inserted into a socket (see 320 of FIGS. 13 and 14).

In exemplary embodiments of the present inventive concept, the card-type SSD 100 may include a shark-fin shaped protrusion 113 at the first edge 123. The protrusion 113 may be located between two straight portions of the first edge 123. The protrusion 113 may stably load the card-type SSD 100 into a socket. Moreover, the protrusion 113 may prevent the card-type SSD 100 from being mistakenly upside down inserted into a socket.

In exemplary embodiments of the present inventive concept, the card-type SSD 100 may include notch 115. The notch 115 may be a protruding structure formed on one surface of the card-type SSD 100, and may extend in the first direction X from the first edge 123 toward the second edge 125. The notch 115 may be disposed adjacent to the withdrawal edge 127, and may be externally exposed when the card-type SSD 100 is inserted into a socket. The notch 115 may assist a user to easily separate the card-type SSD 100 from a socket.

The edges 121, 123, 125, and 127 may each have corners with a certain curvature radius. The corners may have their curvature radii that are the same as each or different from each other.

The card-type SSD 100 may have the insertion edge 121 at its side which will be inserted into a socket, such that among the edges 121, 123, 125, and 127, the insertion edge 121 may first enter the socket when the card-type SSD 100 is inserted into the socket and may last exit from the socket when the card-type SSD 100 is withdrawn from the socket.

The substrate 110 may be provided thereon with terminals that neighbor the insertion edge 121. The terminals that neighbor the insertion edge 121 may be arranged in a plurality of rows to electrically connect a host to semiconductor devices within the card-type SSD 100. The host may be, far example, a laptop computer or a tablet computer, but the present inventive concept is not limited thereto. In addition, an interface adaptor may be interposed between the host and the card-type SSD 100.

The functional terminals FP and the thermal terminals TP may be sequentially arranged neighboring the insertion edge 121 of the substrate 110. The functional terminals FP and the thermal terminals TP may be copper (Cu) patterns coated with, for example, gold (Au).

For example, the first-row functional terminals 130, the second-row functional terminals 140, and the third-row functional terminals 150 may be sequentially arranged neighboring the insertion edge 121 of the substrate 1110. For example, the first-row functional terminals 130, the second-row functional terminals 140, and the third-row functional terminals 150 may be sequentially arranged along the second direction Y. The first-row functional terminals 130 may be arranged most adjacent to the insertion edge 121, the second-row functional terminals 140 may be arranged farther away from the insertion edge 121 than the first-row functional terminals 130, and the third-row functional terminals 150 may be arranged farther away front the insertion edge 121 than the second-row functional terminals 140.

The first-row functional terminals 130 may include a first power terminal 131 for receiving a first voltage. The first voltage may range from about 3.0 V to about 3.5 V. The first voltage may be supplied to the nonvolatile memory device 220 within the card-type SSD 100.

The first-row functional terminals 130 may include one or more first ground terminals 132. For example, the first-row functional terminals 130 may include sixth first ground terminals 132a, 132b, 132c, 132d, 132e, and 132f.

The first-row functional terminals 130 may include first data terminals 134, 135, 136, and 137. For example, the first-row functional terminals 130 may include a pair of first data input terminals 134, a pair of first data output terminals 135, a pair of second data input terminals 136, and a pair of second data output terminals 137.

A pair of ground terminals 132b and 132c may electrically shield the first data input terminals 134. For example, the first data input terminals 134 may be disposed between the ground terminals 132b and 132c. In addition, a pair of ground terminals 132c and 132d may electrically shield the first data output terminals 135.

Likewise, a pair of ground terminals 132d and 132e may electrically shield the second data input terminals 136. In addition, a pair of ground terminals 132e and 132f may electrically shield the second data Output terminals 137.

The first data input terminals 134 and the second data input terminals 136 may have the same dimension as each other. In addition, the first data output terminals 135 and the second data output terminals 137 may have the same dimension as each other. In exemplary embodiments of the present inventive concept, the first data terminals 134, 135, 136, and 137 may all have the same dimension as each other.

The first power terminal 131 may have a first length 131L in the second direction Y greater than a second length 134L in the second direction Y of each of the first data terminals 134, 135, 136, and 137. For example, the first length 131L may range from about 2 mm to about 3 mm, and the second length 134L may range from about 1.3 mm to about 1.7 mm, but the present inventive concept is not limited thereto.

The first power terminal 131 and the first data terminals 134, 135, 136, and 137 may have their front ends toward the insertion edge 121, and the front end of the first power terminals 131 may be closer to the insertion edge 121 than the front ends of the first data terminals 134, 135, 136, and 137. In addition, the first power terminal 131 and the first data terminals 134, 135, 136, and 137 may have their back ends toward the withdrawal edge 127, and the back end of the first power terminals 131 may be closer to the withdrawal edge 127 than the back ends of the first data terminals 134, 135, 136, and 137.

The first-row functional terminals 130 may include a pair of reference clock terminals 133. The reference clock terminals 133 may each receive a clock signal whose frequency is about 26 MHz. The ground terminal 132a may be disposed between the first power terminal 131 and the reference clock terminals 133.

The first-row functional terminals 130 may include one or more first preliminary terminals 138. At least one of the first preliminary terminals 138 may have the same function as that of the first power terminal 131. The first preliminary terminals 138 may each have the same size and dimension as those of the first power terminal 131.

The second-row functional terminals 140 may include a second power terminal 141 for receiving a second voltage. The second voltage may be substantially the same as the first voltage. In exemplary embodiments of the present inventive concept, the second voltage may be supplied to the nonvolatile memory device 220 within the card-type SSD 100.

The second-row functional terminals 140 may include one or more second ground terminals 142. For example, the second-row functional terminals 140 may include six second ground terminals 142a, 142b, 142c, 142d, 142e, and 142f. The second-row functional terminals 140 may include second data terminals 144, 145, 146, and 147. For example, the second-row functional terminals 140 may include a pair of third data input terminals 144, a pair of third data output terminals 145, a pair of fourth data input terminals 146, and a pair of fourth data output terminals 147.

A pair of ground terminals 142b and 142c may electrically shield the third data input terminals 144. In addition, a pair of ground terminals 142c and 142d may electrically shield the third data output terminals 145. For example, the third data output terminals 145 may be disposed between the ground terminals 142c and 142d.

Likewise, a pair of ground terminals 142d and 142e may electrically shield the fourth data input terminals 146. In addition, a pair of ground terminals 142e and 142f may electrically shield the fourth data output terminals 147.

The third data input terminals 144 and the fourth data input terminals 146 may have the same dimension as each other. In addition, the third data output terminals 145 and the fourth data output terminals 147 may have the same dimension as each other. In exemplary embodiments of the present inventive concept, the second data terminals 144, 145, 146, and 147 may all have the same dimension as each other.

The second power terminal 141 may have a length in the second direction Y greater than a length in the second direction Y of each of the second data terminals 144, 145, 146, and 147. For example, the length of the second power terminal 141 may range from about 2 mm to about 3 mm, and the length of each of the second data terminals 144, 145, 146, and 147 may, range from about 1.3 mm to about 1.7 mm.

The second-row functional terminals 140 may include no terminal on a region that corresponds to a region on which the reference clock terminals 133 are disposed. For example, an empty space may be provided between the ground terminals 142a and 142b.

The second-row functional terminals 140 may include one or more second preliminary terminals 148. At least one of the second preliminary terminals 148 may have the same function as that of the second power terminal 141. The second preliminary terminals 148 may each have the same size and dimension as those of the second power terminal 141.

The third-row functional terminals 150 may include a third power terminal 151 for receiving a third voltage. The third voltage may range from about 3.0 V to about 3.5 V. In exemplary embodiments of the present inventive concept, the third voltage may be substantially the same as the first and second voltages. In other exemplary embodiments of the present inventive concept, the third voltage may be different from the first and second voltages. The third voltage may be supplied to the memory controller 210 within the card-type SSD 100.

The third-row functional terminals 150 may include one or more ground terminals 152. For example, the third-row functional terminals 150 may have three ground terminals 152a, 152b, and 152c.

The third-row functional terminals 150 may include command terminals 153 and test terminals 154. A pair of ground terminals 152b and 152c may electrically shield the command terminals 153 and the test terminals 154.

The command terminals 153 and the test terminals 154 may have the same dimension as each other. The third power terminal 151 may have a length in the second direction Y greater than a length in the second direction Y of each of the command and test terminals 153 and 154. For example, the length of the third power terminal 151 may range from about 2 mm to about 3 mm, and the length of each of the command and test terminals 153 and 154 may range from about 1.3 mm to about 1.7 mm.

The number of the command terminals 153 may be different from the number of the test terminals 154. The number of the test terminals 154 may be greater than the number of the command terminals 153, but the present inventive concept is not limited thereto.

The third-row functional terminals 150 may have no terminal on a region that corresponds to a region on which the reference clock terminals 133 are disposed. For example, an empty space may be provided between the ground terminals 152a and 152b.

The third-row functional terminals 150 may include one or more third preliminary terminals 158. At least one of the third preliminary terminals 158 may have the same function as that of the third power terminal 151. The third preliminary terminals 158 may each have the same size and dimension as those of the third power terminal 151.

The first, second, and third power terminals 131, 141, and 151 may be linearly arranged along the second direction Y, while neighboring the first edge 123. For example, the first-, second-, and third-row functional terminals 130, 140, and 150 may be configured such that the first, second, and third power terminals 131, 141, and 151 are disposed at the same position on their rows. Accordingly, an electrical power may be stably supplied to the nonvolatile memory device 220 and the memory controller 210.

The first-, second-, and third-row functional terminals 130, 140, and 150 may each have an input/output terminal structure, in accordance with the standard of Peripheral Component Interconnect Express (PCIe) 4-lane.

As discussed above, the first-, second-, and third-row functional terminals 130, 140, and 150 may include their terminals having electrical functions. Moreover, at least one of the first-row functional terminals 130, at least one of the second-row functional terminals 140, and at least one of the third-row functional terminals 150 may be electrically connected to the memory controller 210 and/or the nonvolatile memory device 220.

The thermal terminals TP may be arranged in at least one row. In exemplary embodiments of the present inventive concept, the thermal terminals TP may include terminals for heat radiation in a single row or in a plurality of rows. For example, the thermal terminals TP may include the first-row thermal terminals 160 and the second-row thermal terminals 170.

The first-row thermal terminals 160 and the second-row thermal terminals 170 may be sequentially arranged neighboring the third-row functional terminals 150. The first-row thermal terminals 160 may be arranged farther away from the insertion edge 121 than the third-row functional terminals 150, and the second-row thermal terminals 170 may be arranged farther away from the insertion edge 121 than the first-row thermal terminals 160. The first-row thermal terminals 160 and the second-row thermal terminals 170 may be arranged closer to the withdrawal edge 127 than to the insertion edge 121. The second-row thermal terminals 170 may be arranged closer to the withdrawal edge 127 than the first-row thermal terminals 160.

Since the thermal terminals TP are disposed farther away than the functional terminals FP from the insertion edge 121, it is less likely that the thermal terminals TP will be in contact with connection pins that supply power to the first power terminal 131, the second power terminal 141, and the third power terminal 151. Accordingly, it is possible to prevent an electrical short that can occur when the thermal terminals TP are in contact with the connection pins for power supply.

The first-row thermal terminals 160 may be linearly arranged along the first direction X. The first-row thermal terminals 160 may have the same dimension as each other. The first-row thermal terminals 160 may each have a length of about 1.3 mm to about 1.7 mm in the second direction Y, but the present inventive concept is not limited thereto.

Among the first-row thermal terminals 160, a first-row thermal terminal 160E most adjacent to the first edge 123 may be spaced apart along the first direction X at a first interval D1 from the first power terminal 131, the second power terminal 141, and the third power terminal 151.

For example, the first-row thermal terminal 160E most adjacent to the first edge 123 may not be aligned along the second direction Y with the first power terminal 131, the second power terminal 141, or the third power terminal 151.

The second-row thermal terminals 170 may be linearly arranged along the first direction X. The second-row thermal terminals 170 may have the same dimension as each other. The second-raw thermal terminals 170 may each have a length, e.g., 162L, of about 1.3 mm to about 1.7 mm in the second direction Y, but the present inventive concept is not limited thereto. In exemplary embodiments of the present inventive concept, the first-row thermal terminals 160 and the second-row thermal terminals 170 may have the same dimension as each other.

Among the second-row thermal terminals 170, a second-row thermal terminal 170E most adjacent to the first edge 123 may be spaced apart along the first direction X from the first power terminal 131, the second power terminal 141, and the third power terminal 151. For example, the second-row thermal terminal 170E most adjacent to the first edge 123 may not be aligned along the second direction Y with the first power terminal 131, the second power terminal 141, or the third power terminal 151.

The thermal terminals TP may not be electrically connected to the memory controller 210 or the nonvolatile memory device 220. In exemplary embodiments of the present inventive concept, the thermal terminals TP may also serve as ground terminals. At least one of the thermal terminals TP may vertically overlap the memory controller 210 or the nonvolatile memory device 220.

Each of terminals included in the functional and thermal terminals FP and TP may have a corresponding one of first widths 131W, 134W, and 162W in the first direction X that are substantially the same as each other, for example, about 0.5 mm to about 0.9 mm, but the present inventive concept is not limited thereto.

In FIG. 1C, there are illustrated nineteen first-row functional terminals 130, seventeen second-row functional terminals 140, seventeen third-row functional terminals 150, eighteen first-row thermal terminals 160, and eighteen second-row thermal terminals 170, but the number, position, shape, and size of the terminals are not limited to those shown in FIG. 1C and may be changed. Furthermore, one or more of the third-row functional terminals 150 may be coated with a solder resist layer, thereby not being exposed externally. The non-exposed third-row functional terminals 150 may be, for example, the test terminals 154.

The card-type SSD 100 according to exemplary embodiments of the present inventive concept may include a plurality of thermal terminals, and the thermal terminals may contact connection pins positioned within a socket and transfer heat to a system board, thereby preventing a significant increase in temperature of the card-type SSD 100. Accordingly, the card-type SSD 100 may be prevented from being damaged due to an increase in temperature during operation even at high speeds and thus, may increase in reliability.

FIGS. 2 to 12 illustrate bottom views showing a card-type solid state drive according to exemplary embodiments of the present inventive concept.

The following card-type solid state drives 100A, 100B, 100C, 100D, 100E, 100F, 100G, 100H, 100I, 100J, and 100K may include components substantially the same as or similar to those discussed above with reference to FIGS. 1A to 1D. Therefore, descriptions in FIGS. 1A to 1D are identically or analogously applicable to the embodiments below. Thus, to avoid repetitive descriptions, the following explanations will focus on differences from the card-type SSD 100 mentioned above.

Figure 2:
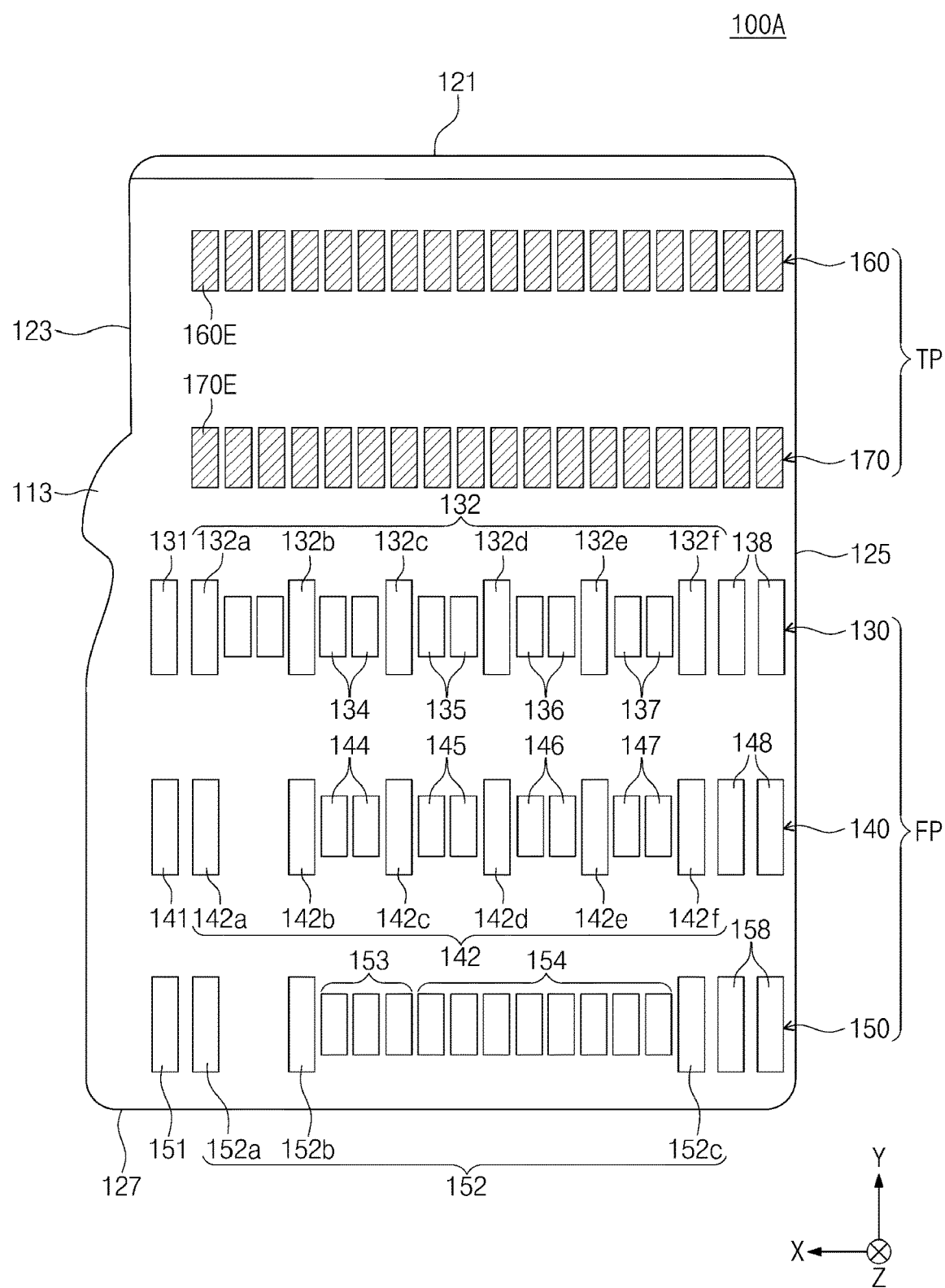
FIGS. 2, 3, 4, 5, 6, 7, 8, 9, 10, 11 and 12 illustrate bottom views showing a card-type solid state drive according to exemplary embodiments of the present inventive concept.
Figure 3:
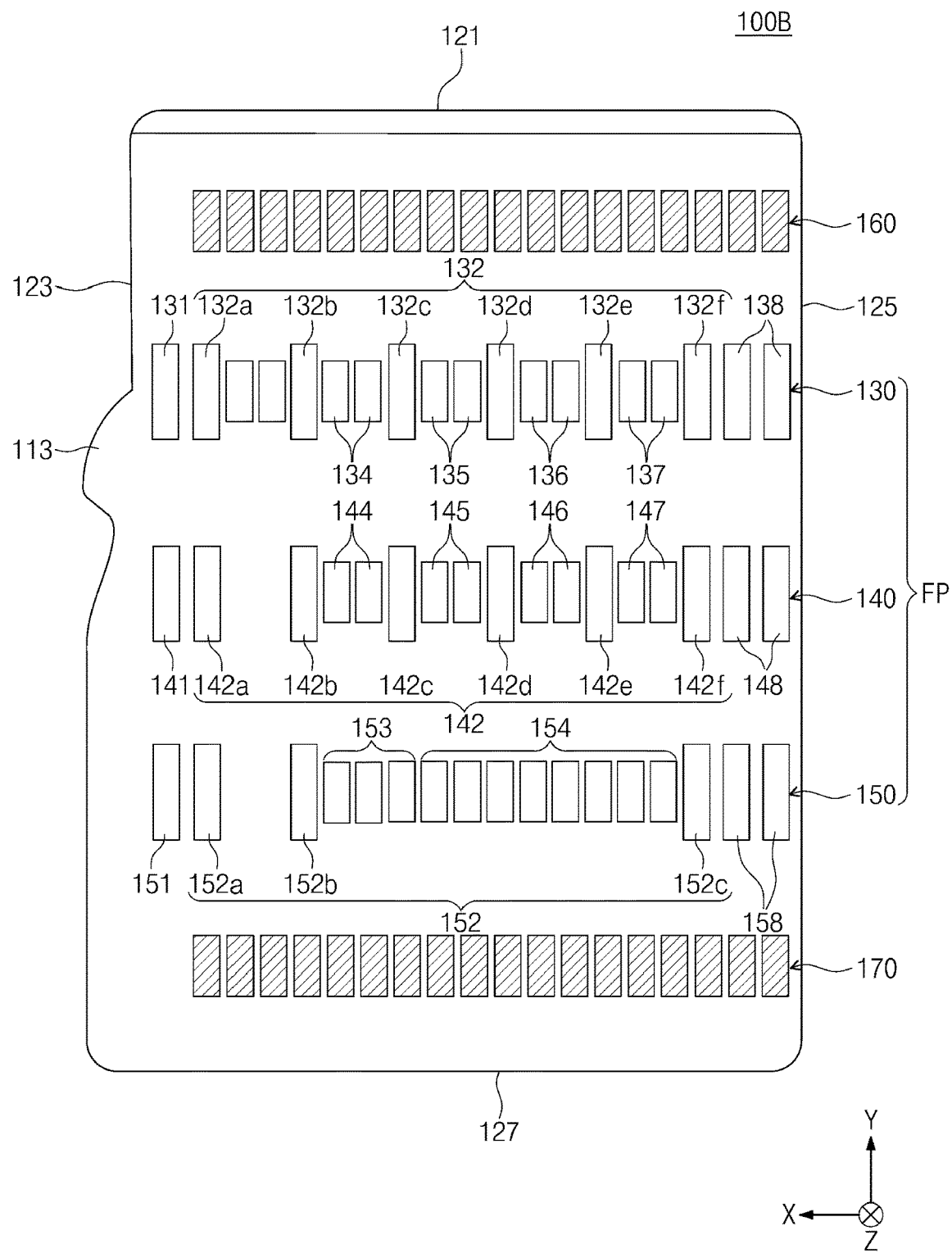

Referring to FIGS. 2 and 3, the thermal terminals TP may include first-row thermal terminals 160 and second-row thermal terminals 170.

In the case of FIG. 2, the first- and second-row thermal terminals 160 and 170 may be disposed closer to the insertion edge 121 than the functional terminals FP. The first-row thermal terminals 160 may be arranged neighboring the insertion edge 121, and the second-row thermal terminals 170 may be arranged farther away than the first-row thermal terminals 160 from the insertion edge 121.

The first-, second-, and third-row functional terminals 130, 140, and 150 may be arranged farther away from the insertion edge 121 than the second-row thermal terminals 170. The third-row functional terminals 150 may be arranged neighboring the withdrawal edge 127.

Among the first- and second-row thermal terminals 160 and 170, the first-row and second-row thermal terminals 160E and 170E most adjacent to the first edge 123 may be spaced apart along the first direction X from the first power terminal 131, the second power terminal 141, and the third power terminal 151. For example, the second-row thermal terminal 170E most adjacent to the first edge 123 may not be aligned along the second direction Y with the first power terminal 131, the second power terminal 141, or the third power terminal 151.

Therefore, when the card-type SSD 100A is inserted into a socket, the first- and second-row thermal terminals 160 and 170 may not be in contact with connection pins that supply power to the first power terminal 131, the second power terminal 141, and the third power terminal 151. An electrical short may be prevented due to the non-contact of the first- and second-row thermal terminals 160 and 170 with the connection pins for power supply.

In the case of FIG. 3, the functional terminals FP may be interposed between the first-row thermal terminals 160 and the second-row thermal terminals 170. The first-, second-, and third-row functional terminals 130, 140, and 150 may be disposed on a central portion of the substrate 110, and the first-row thermal terminals 160 and the second-row thermal terminals 170 may be disposed adjacent to the insertion edge 121 and the withdrawal edge 127, respectively.

The placement of the memory controller 210 and the nonvolatile memory device 220 on the substrate 110 may depend on design of the card-type SSD 100B. According to exemplary embodiments of the present inventive concept, it is possible to adjust the arrangement of the thermal terminals TP.

Accordingly, in exemplary embodiments of the present inventive concept, at least one of the thermal terminals TP may vertically overlap the memory controller 210 and/or the nonvolatile memory device 220, and thus heat may be effectively removed from the memory controller 210 and/or nonvolatile memory device 220.

Referring to FIGS. 4 to 7, the thermal terminals TP may include thermal terminals 160 arranged in a single row.

Figure 4:
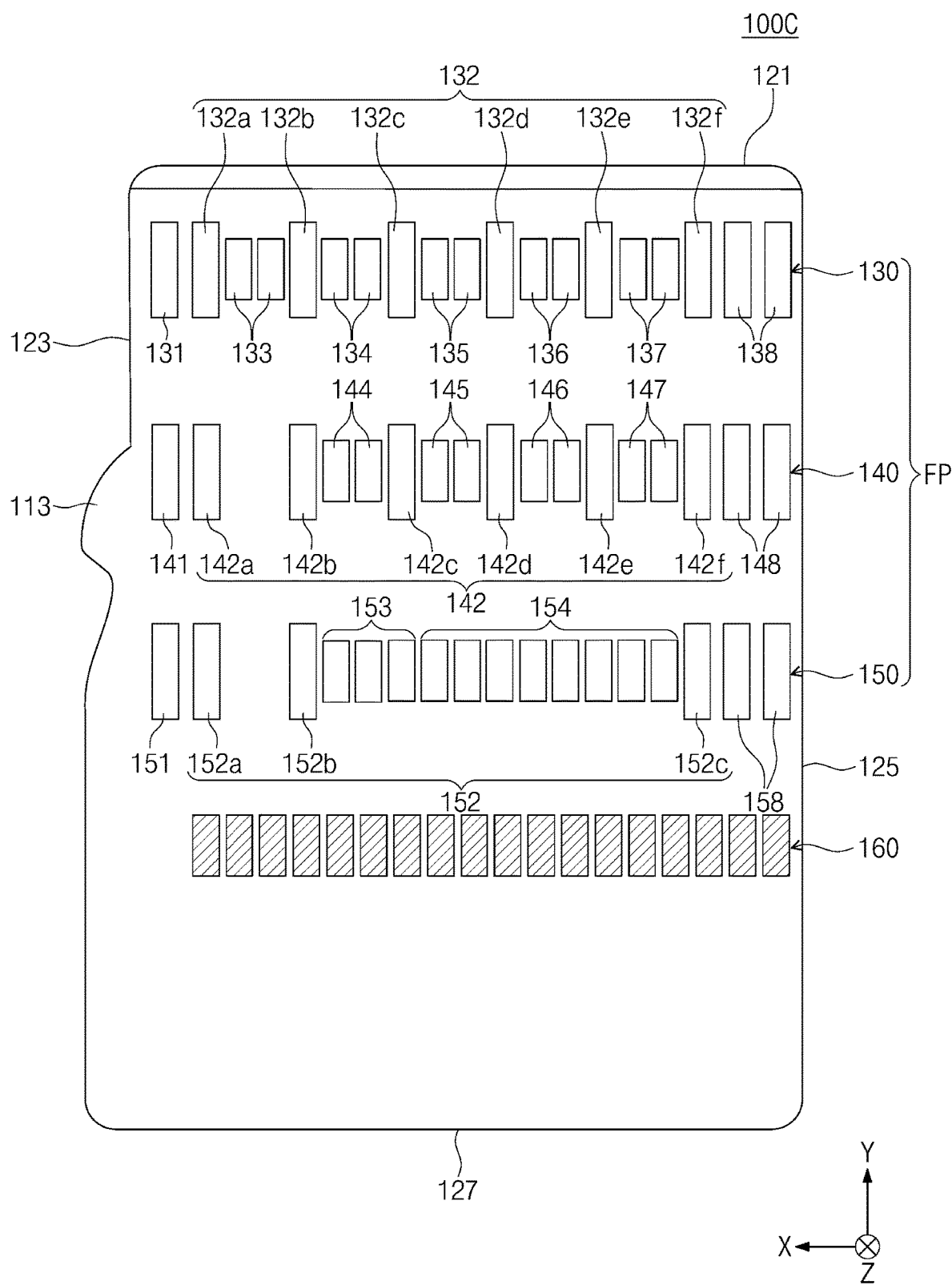

In the case of FIG. 4, the functional terminals FP may be arranged close to the insertion edge 121. The single-row thermal terminals 160 may be arranged farther away from the insertion edge 121 than the third-row functional terminals 150. The single-row thermal terminals 160 may be arranged closer to the third-row functional terminals 150 than to the withdrawal edge 127. An interval distance between the single-row thermal terminals 160 and the third-row functional terminals 150 may be less than an interval distance between the single-row thermal terminals 160 and the withdrawal edge 127.

Figure 5:
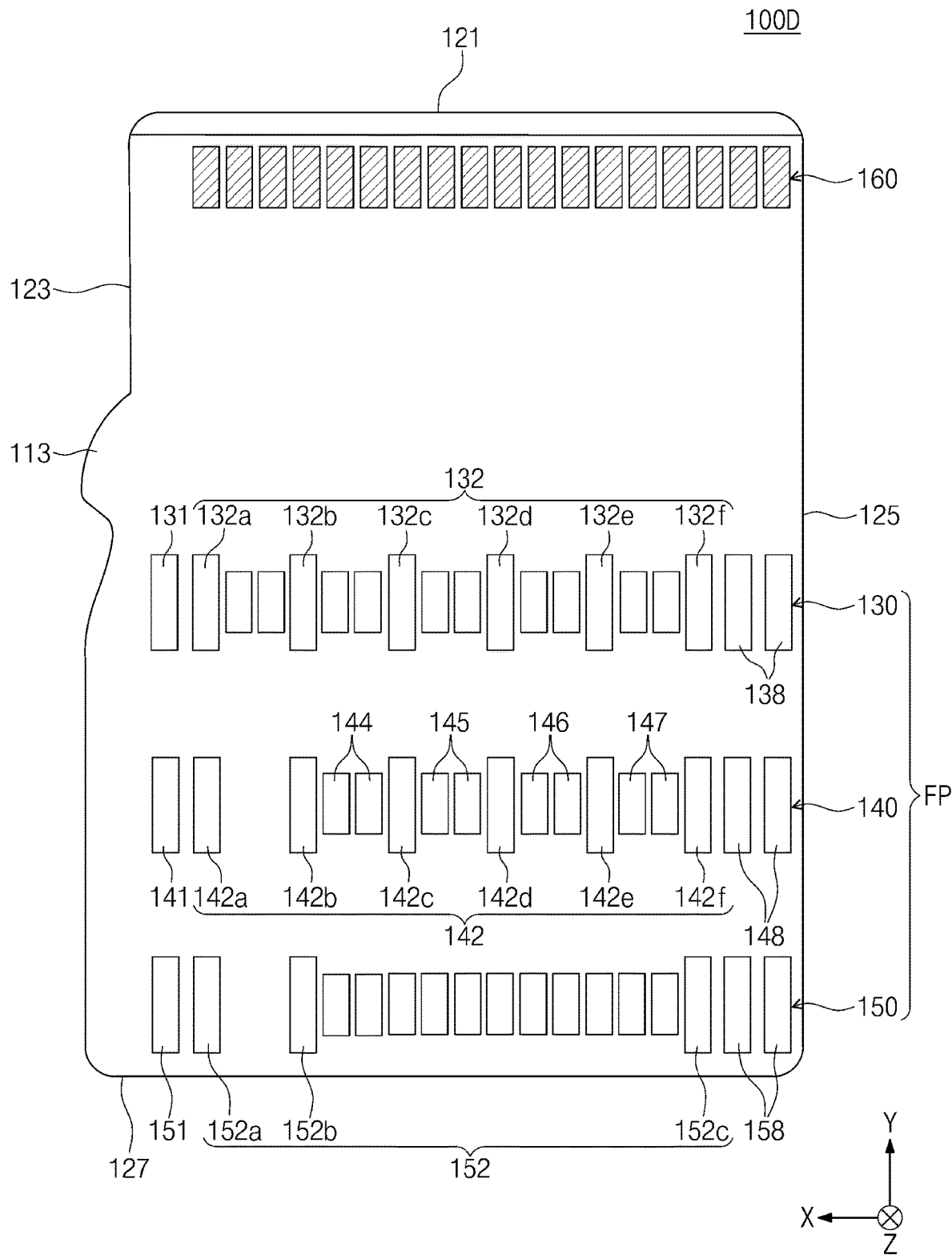

In the case of FIG. 5, the functional terminals FP may be arranged close to the withdrawal edge 127. The single-row thermal terminals 160 may be arranged closer to the insertion edge 121 than the first-row functional terminals 130. An interval distance between the single-row thermal terminals 160 and the insertion edge 121 may be less than an interval distance between the single-row thermal terminals 160 and the first-row functional terminals 130.

Figure 6:
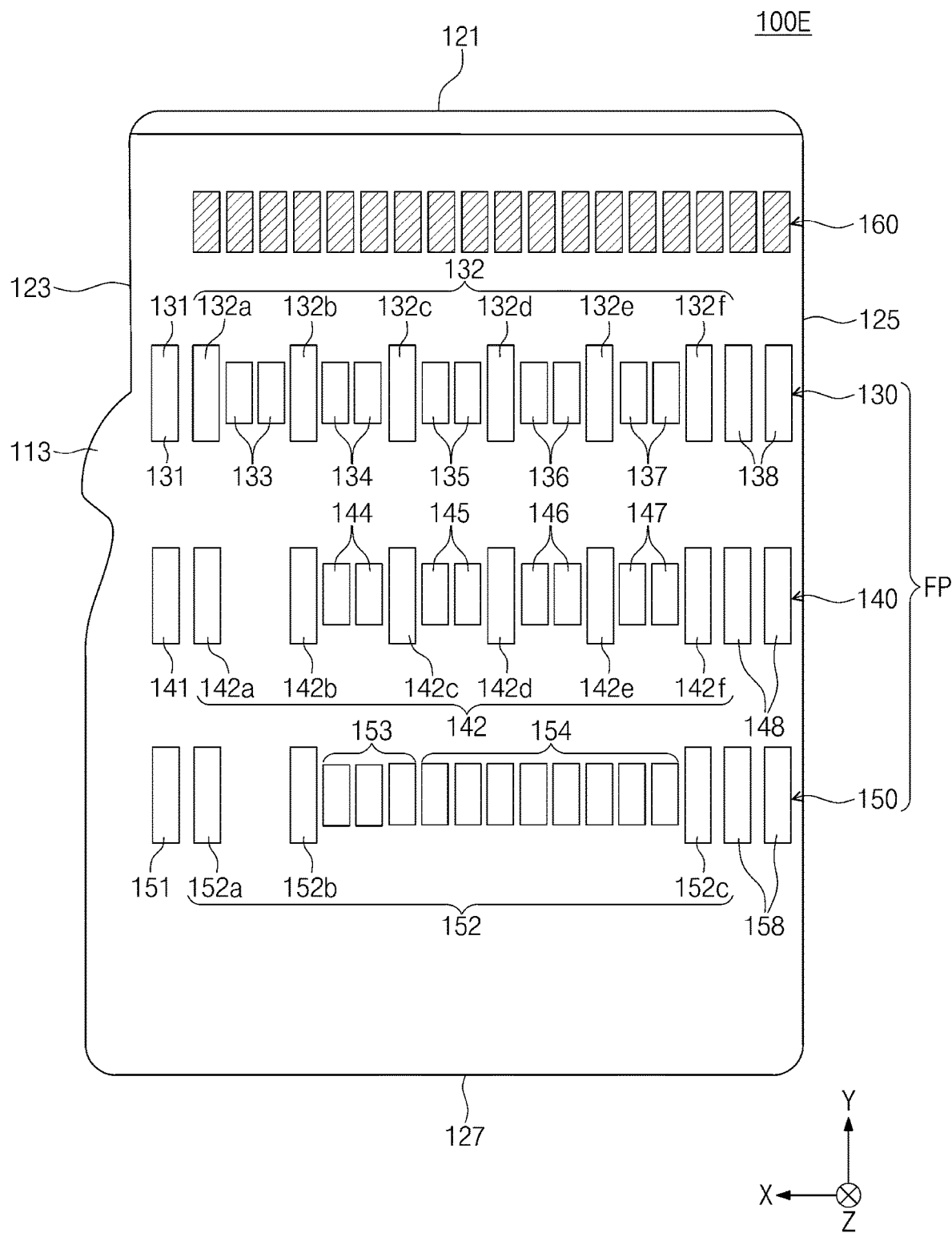

In the case of FIG. 6, the functional terminals FP may be arranged on a central portion of the substrate 110. The single-row thermal terminals 160 may be arranged closer to the insertion edge 121 than the first-row functional terminals 130. An interval distance between the single-row thermal terminals 160 and the insertion edge 121 may be substantially the same as an interval distance between the single-row thermal terminals 160 and the first-row functional terminals 130.

Figure 7:
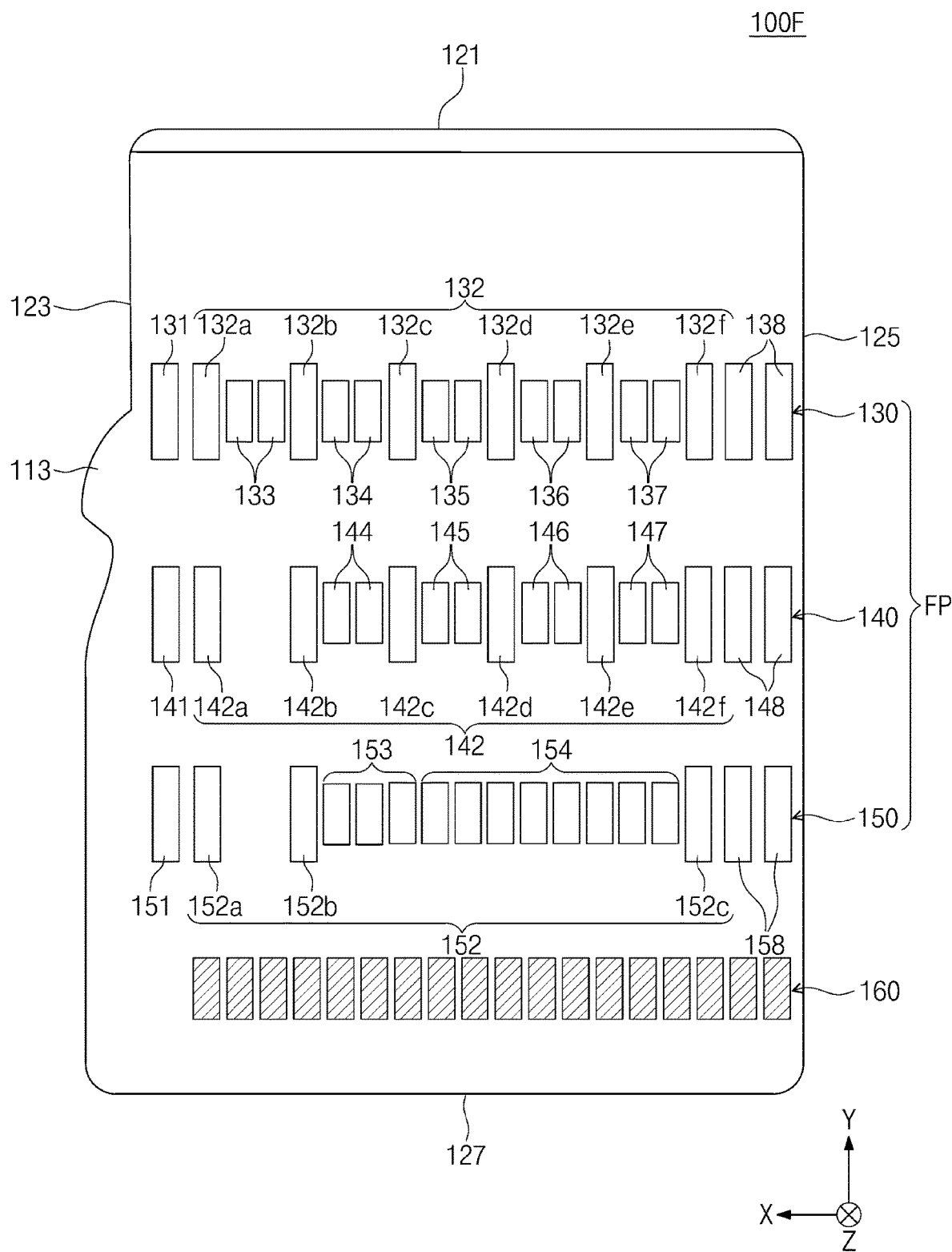

In the case of FIG. 7, the functional terminals FP may be arranged on a central portion of the substrate 110. The single-row thermal terminals 160 may be arranged farther away from the insertion edge 121 than the third-row functional terminals 150. The single-row thermal terminals 160 may be arranged neighboring the withdrawal edge 127.

Referring to FIGS. 8 to 11, the thermal terminals TP may include first-row thermal terminals 160, second-row thermal terminals 170, and third-row thermal terminals 180.

Figure 8:
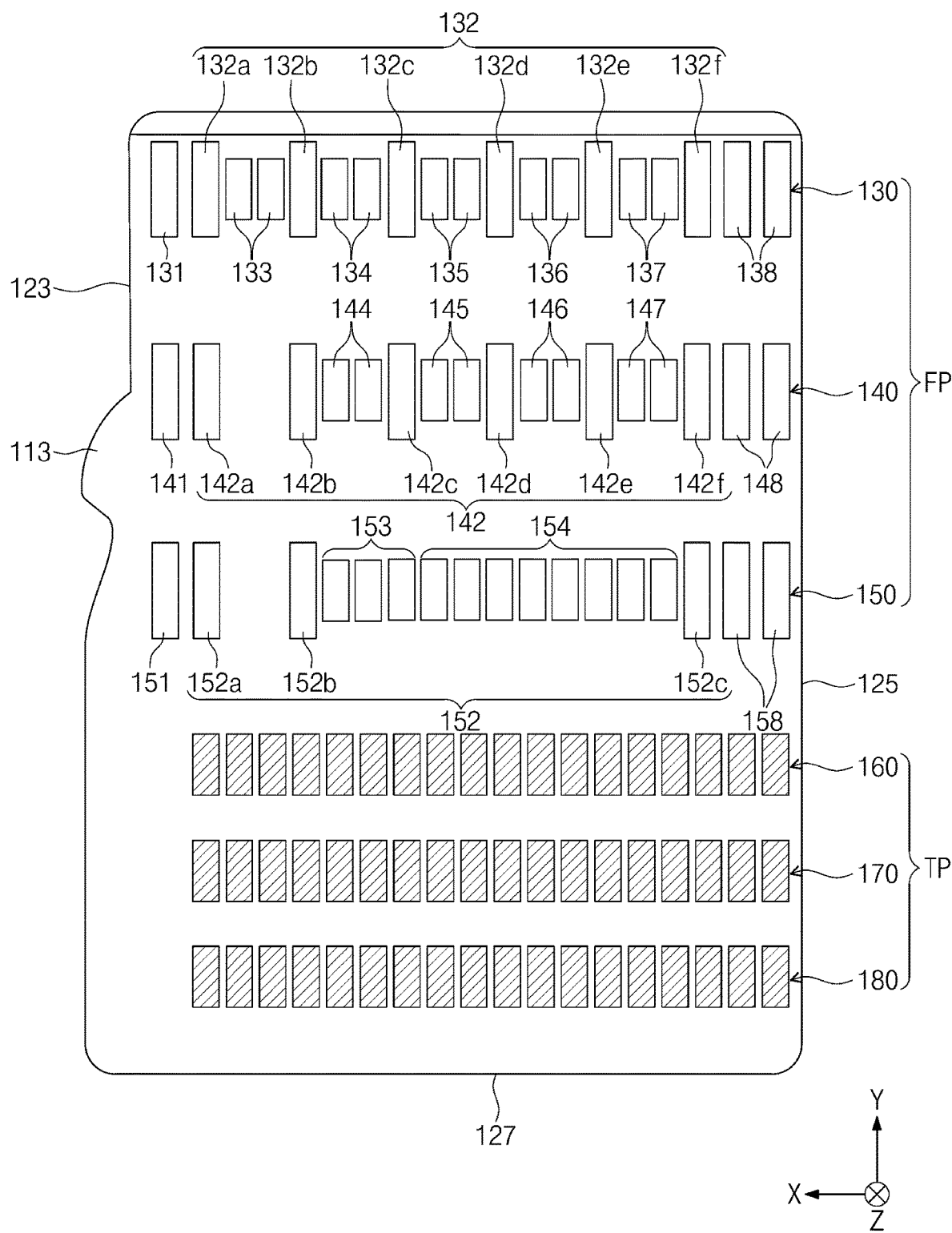

In the case of FIG. 8, the functional terminals FP may be arranged on a top end of the substrate 110, and the thermal terminals TP may be arranged on a bottom end of the substrate 110. The thermal terminals TP may be arranged farther away from the insertion edge 121 than the third-row functional terminals 150.

For example, the first-row thermal terminals 160 may be arranged farther away than the third-row functional terminals 150 from the insertion edge 121. The second-row thermal terminals 170 may be arranged farther away than the first-row thermal terminals 160 from the insertion edge 121. The third-row thermal terminals 180 may be arranged farther away than the second-row thermal terminals 170 from the insertion edge 121, and may be disposed neighboring the withdrawal edge 127.

Figure 9:
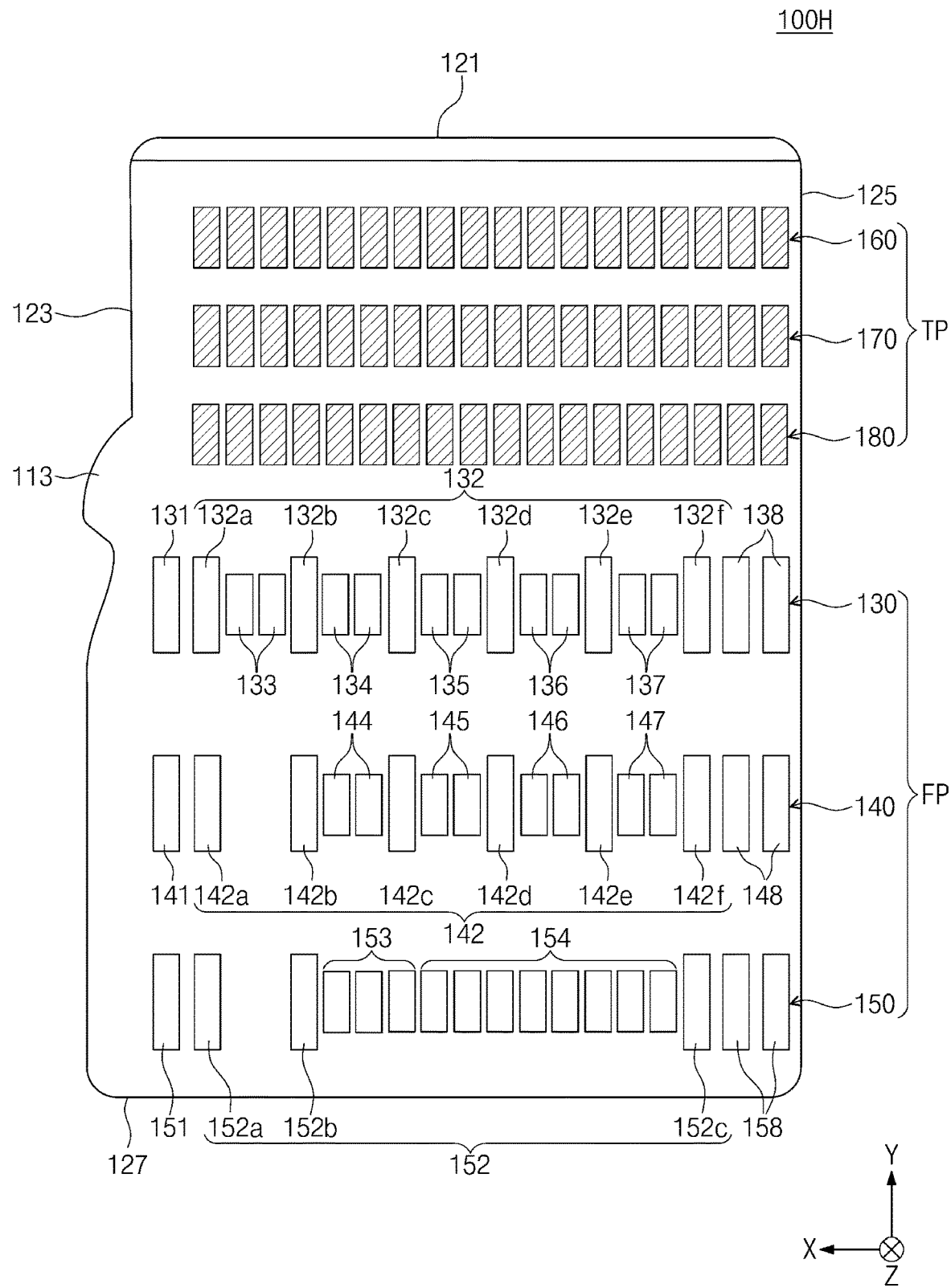

In the case of FIG. 9, the functional terminals FP may be arranged close to the withdrawal edge 127, and the thermal terminals TP may be arranged close to the insertion edge 121. The thermal terminals TP may be arranged closer than the first-row functional terminals 130 to the insertion edge 121.

For example, the first-row thermal terminals 160 may be arranged neighboring the insertion edge 121. The second-row thermal terminals 170 may be arranged farther away from the insertion edge 121 than the first-row thermal terminals 160. The third-row thermal terminals 180 may be arranged farther away from the insertion edge 121 than the second-row thermal terminals 170.

Figure 10:
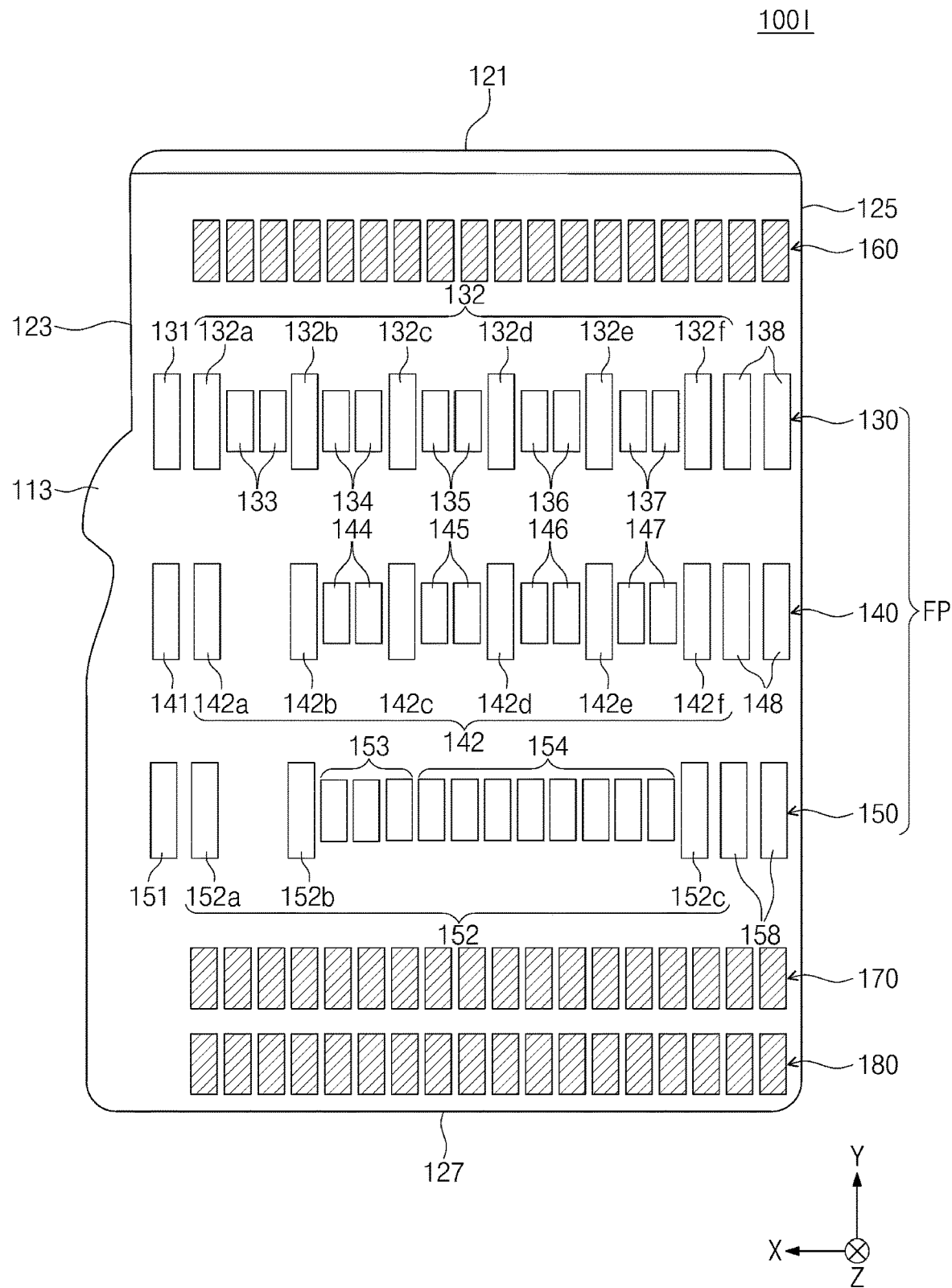

In the case of FIG. 10, the functional terminals FP may be arranged on a central portion of the substrate 110, the first-row thermal terminals 160 may be arranged close to the insertion edge 121, and the second- and third-row thermal terminals 170 and 180 may be arranged close to the withdrawal edge 127.

The functional terminals FP may be arranged between the first-row thermal terminals 160 and the second-row thermal terminals 170. For example, the first-row thermal terminals 160 may be arranged neighboring the insertion edge 121. The second-row thermal terminals 170 may be arranged farther away from the insertion edge 121 than the third-row functional terminals 150. The third-row thermal terminals 180 may be arranged farther away from the insertion edge 121 than the second-row thermal terminals 170, and may be disposed neighboring the withdrawal edge 127.

Figure 11:
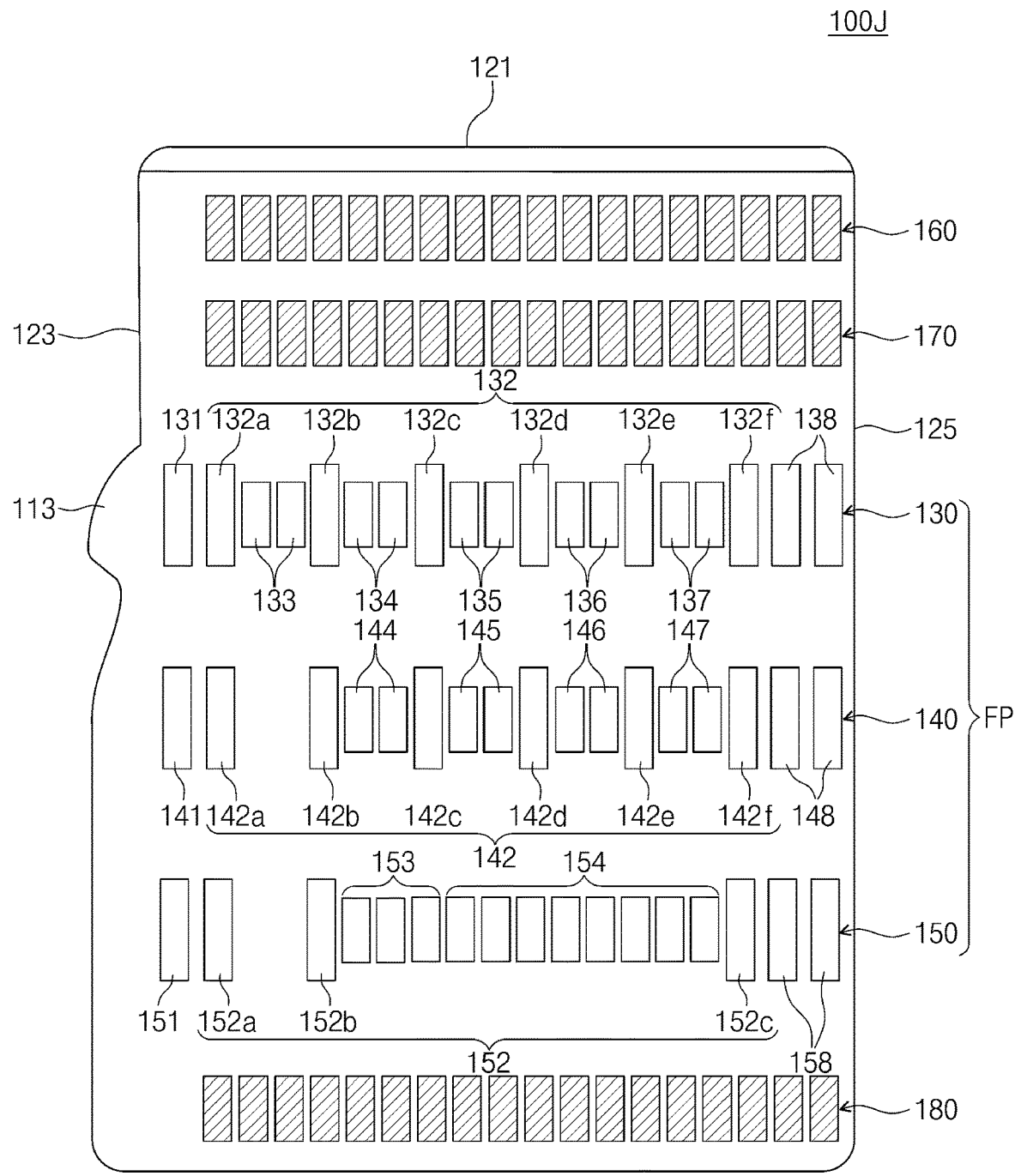
Figure 11:
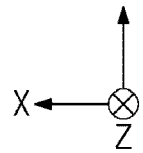

In the case of FIG. 11, the functional terminals FP may be arranged on a central portion of the substrate 110, the first- and second-row thermal terminals 160 and 170 may be arranged dose to the insertion edge 121, and the third-row thermal terminals 180 may be arranged close to the withdrawal edge 127.

For example, the first-row thermal terminals 160 may be arranged neighboring the insertion edge 121. In other words, the first-row thermal terminals 160 may be adjacent to the insertion edge 121. The second-row thermal terminals 170 may be arranged farther away from the insertion edge 121 than the first-row thermal terminals 160, and may be arranged closer to the insertion edge 121 than the first-row functional terminals 130. The third-row thermal terminals 180 may be arranged farther away from the insertion edge 121 than the third-row functional terminals 150, and may be disposed neighboring the withdrawal edge 127.

Figure 12:
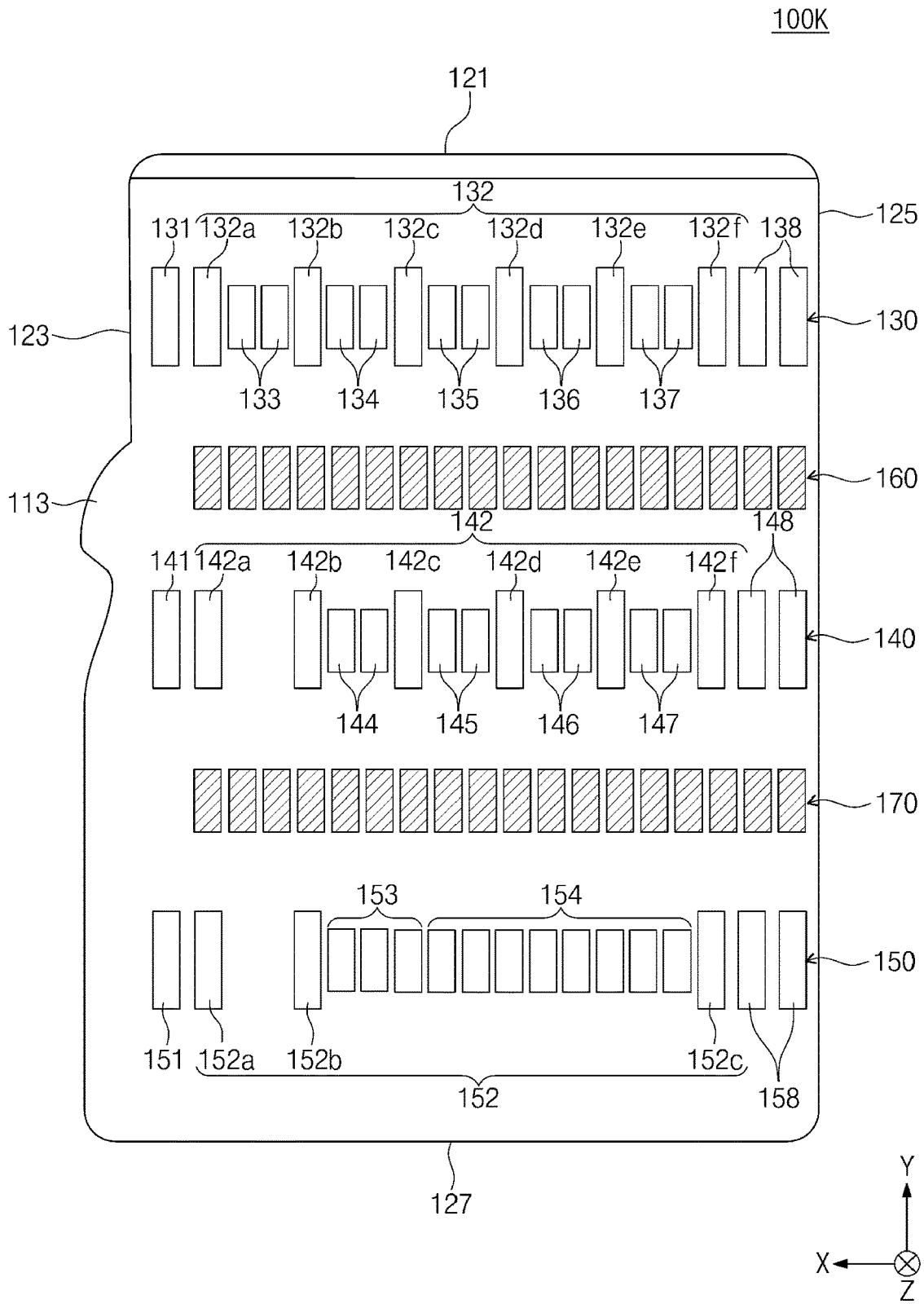

Referring to FIG. 12, the first-row thermal terminals 160 may be arranged between the first-row functional terminals 130 and the second-row functional terminals 140, and the second-row thermal terminals 170 may be arranged between the second-row functional terminals 140 and the third-row functional terminals 150.

The first-row functional terminals 130 may be disposed close to the insertion edge 121, the second-row functional terminals 140 may be disposed on a central portion of the substrate 110, and the third-row functional terminals 1 may be disposed close to the withdrawal edge 127.

Figure 13:
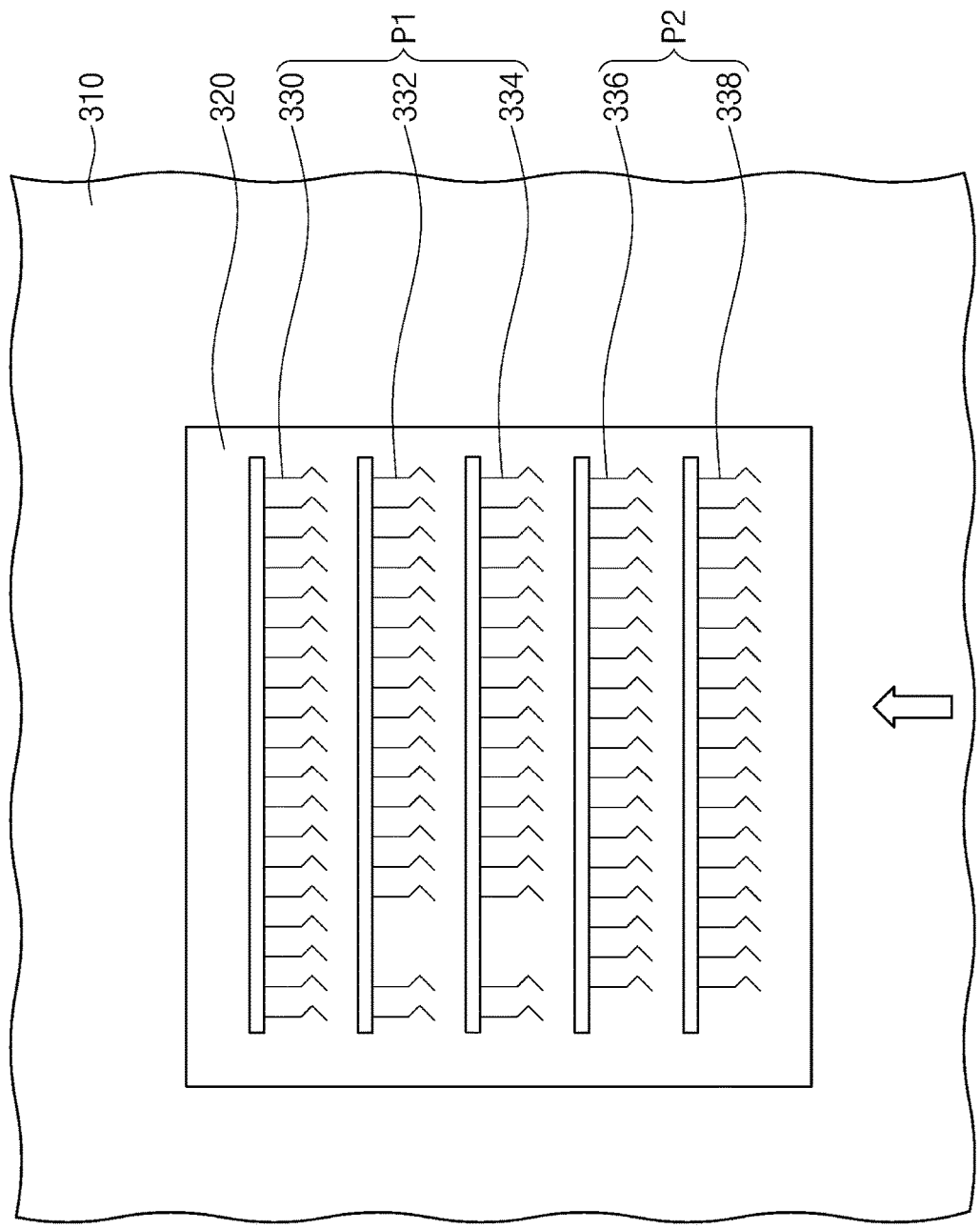
FIG. 13 illustrates a schematic diagram showing an electronic apparatus including a card-type solid state drive according to exemplary embodiments of the present inventive concept.
Figure 14:
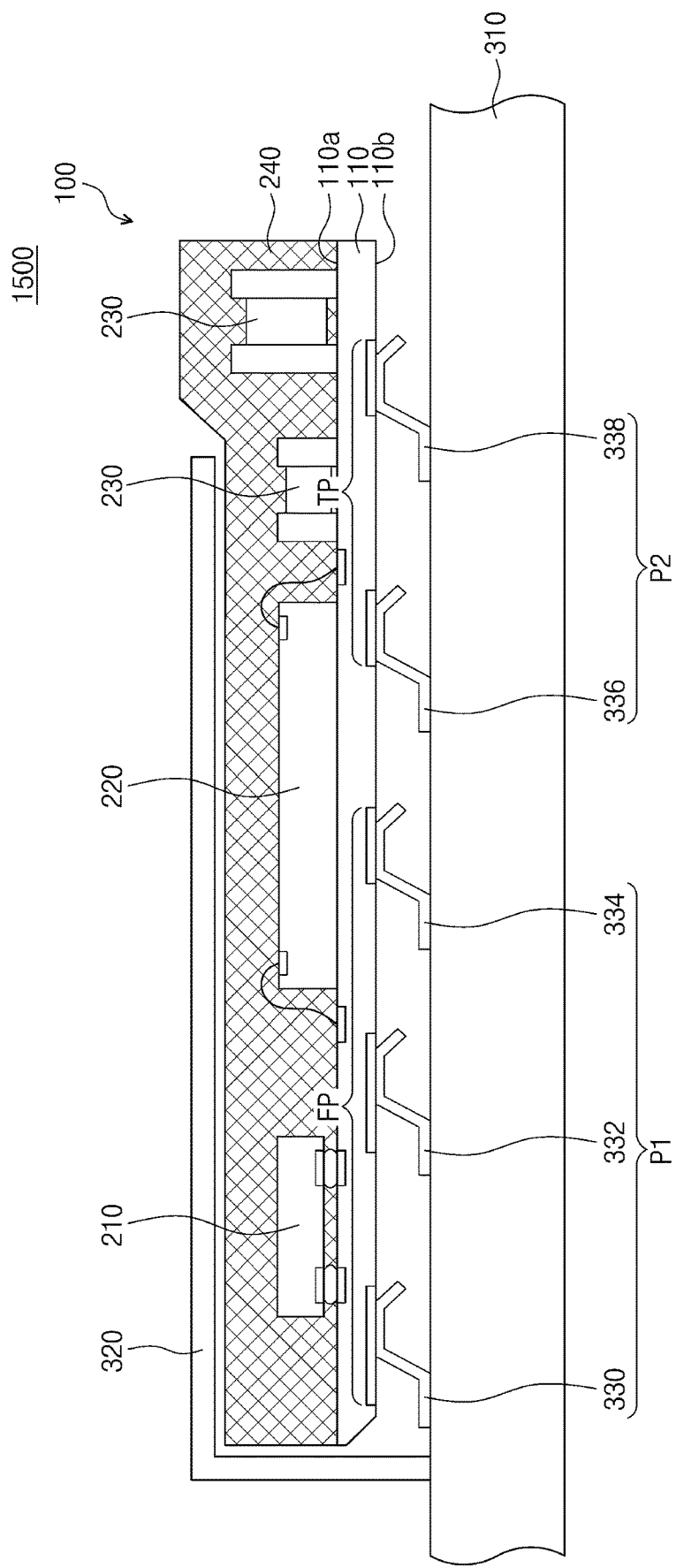
FIG. 14 illustrates a cross-sectional view showing an electronic apparatus including a card-type solid state drive according to exemplary embodiments of the present inventive concept.

FIG. 13 illustrates a schematic diagram showing an electronic apparatus including a card-type solid state drive according to exemplary embodiments of the present inventive concept. FIG. 14 illustrates a cross-sectional view showing an electronic apparatus including a card-type solid state drive according to exemplary embodiments of the present inventive concept. In FIG. 13, the illustration of the card-type SSD is omitted to clearly disclose components of an electronic apparatus.

Referring to FIGS. 13 and 14, an electronic apparatus 1500 may include a system board 310, a socket 320 on the system board 310, first connection pins P1 attached to the system board 310, and second connection pins P2 attached to the system board 310. The socket 320 may receive the card-type SSD 100 and may surround the first and second connection pins P1 and P2. The socket 320 may be provided therein with the first connection pins P1 and the second connection pins P2. An arrow in FIG. 13 indicates an insertion direction of the card-type SSD 100 into the socket 320.

When the card-type SSD 100 is inserted into the socket 320, the first connection pins P1 may contact the functional terminals FP and the second connection pins P2 may contact the thermal terminals TP. The system board 310 may be electrically connected through the first connection pins P1 to the card-type SSD 100, but may not be electrically connected through the second connection pins P2 to the card-type SSD 100.

The first connection pins P1 may include first row functional pins 330, second-row functional pins 332, and third-row functional pins 334. The first-row functional pins 330, the second-row functional pins 332, and the third-row functional pins 334 may contact the first-row functional terminals 130, the second-row functional terminals 140, and the third-row functional terminals 150, respectively.

The second connection pins P2 may include first-row thermal pins 336 and second-row thermal pins 338. The first-row thermal pins 336 and the second-row thermal pins 338 may contact the first-row thermal terminals 160 and the second-row thermal terminals 170, respectively.

The second connection pins P2 may transfer and discharge heat from the card-type SSD 100 to the system board 310, and may prevent a dramatic increase in temperature of the card-type SSD 100.

Figure 15:
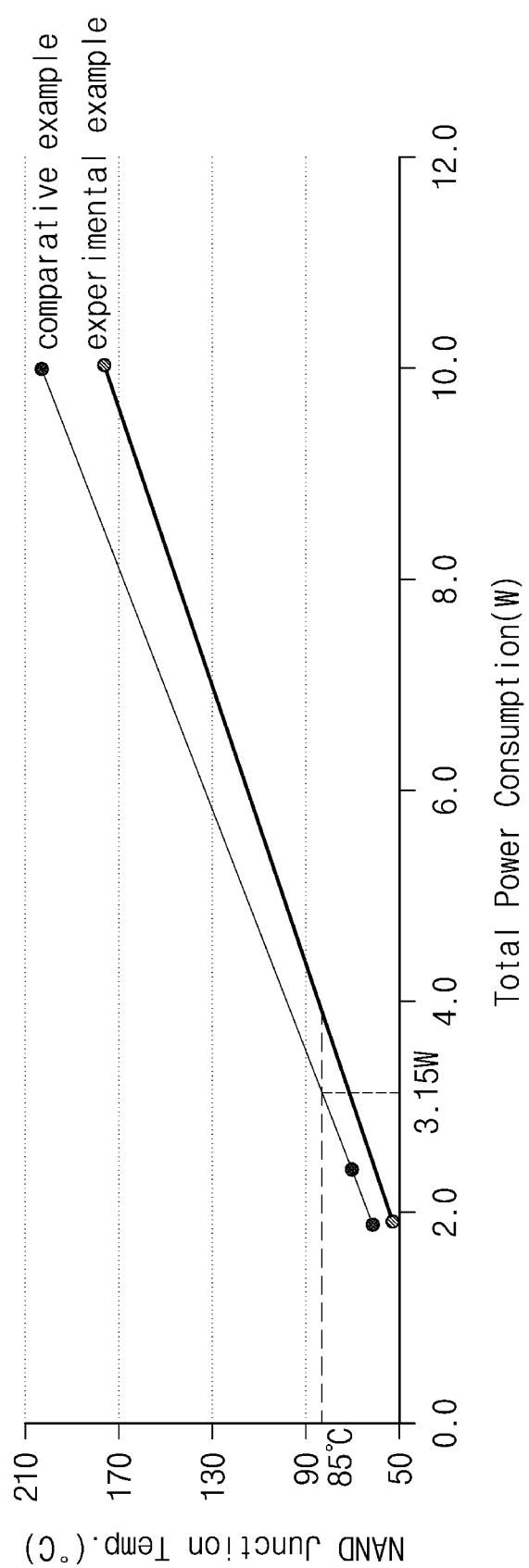
FIG. 15 illustrates a graph showing temperature of a card-type solid state drive according to exemplary embodiments of the present inventive concept.

FIG. 15 illustrates a graph showing temperature variations according to an experimental example and a comparative example.

The comparative example relates to a card-type SSD including only functional terminals, and the experimental example relates to a card-type SSD including functional and thermal terminals according to exemplary embodiments of the present inventive concept.

Referring to FIG. 15, under the same power consumption, a surface temperature of the nonvolatile memory device may be lower in the experimental example than in the comparative example. This is because that the thermal terminals TP and their connected connection pins P2 discharge heat from the card-type SSD to a system board.

Figure 16:
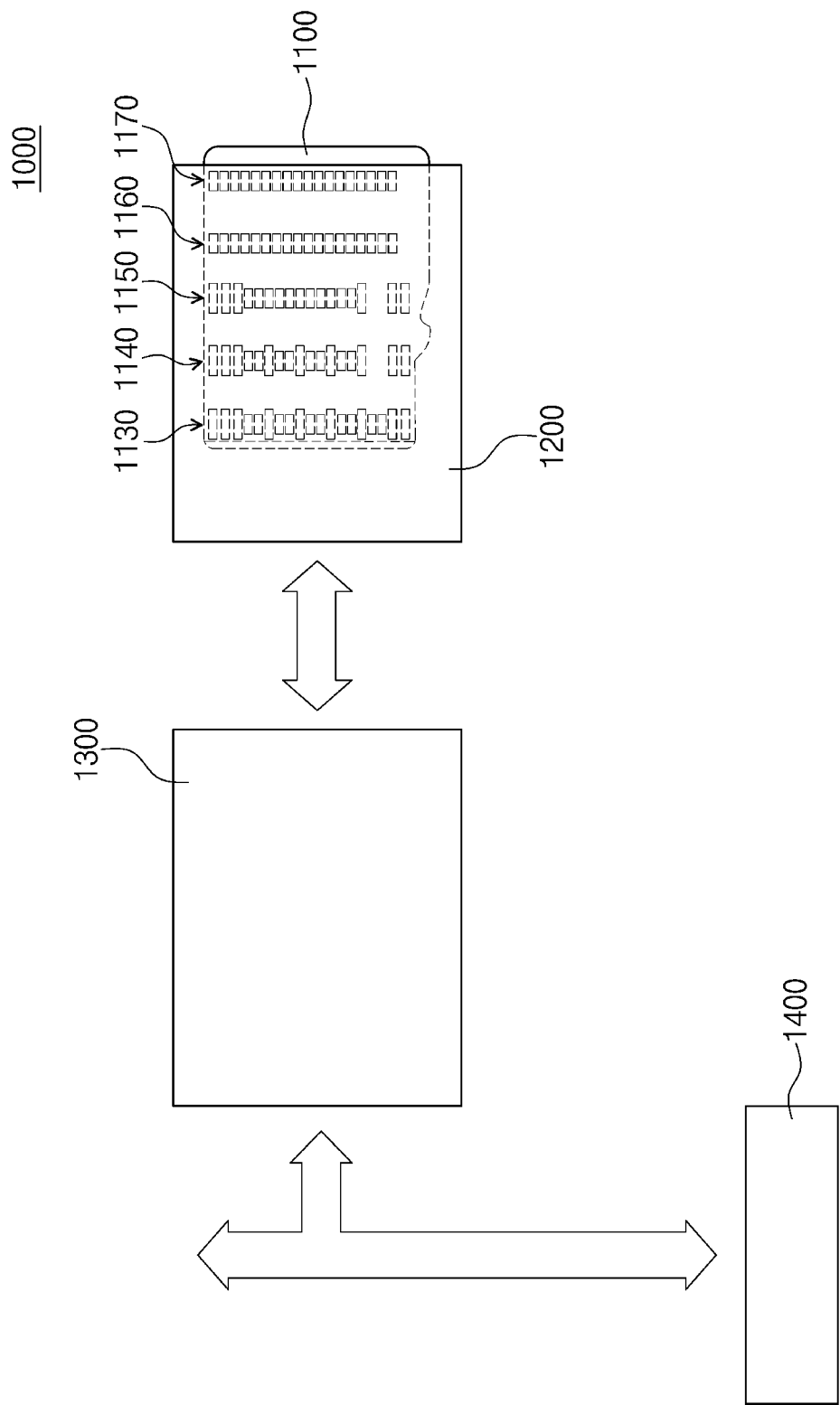
FIG. 16 illustrates a schematic diagram showing a system including a card-type solid state drive according to exemplary embodiments of the present inventive concept.

FIG. 16 illustrates a schematic diagram showing a system including a card-type solid state drive according to exemplary embodiments of the present inventive concept.

Referring to FIG. 16, a system 1000 may include a card-type SSD 1100, a socket 1200, a controller 1300, and a host 1400. The card-type SSD 1100 may include one of the card-type SSDs 100, 100A, 100B, 100C, 100F, 100E, 100F, 100G, 100H, 100I, 100J, and 100K that are discussed above according to exemplary embodiments of the present inventive concept.

The socket 1200 may receive the card-type SSD 1100, and may be provided therein with connection pins that are connected to first-row functional terminals 1130, second-row functional terminals 1140, third-row functional terminals 1150, first-row thermal terminals 1160, and second-row thermal terminals 1170 of the card-type SSD 1100.

The controller 1300 may use the socket 1200 to control data communication with the card-type SSD 1100. The controller 1300 may be used to store data in the card-type SSD 1100.

The host 1400 may be an electronic apparatus, such as a smart phone, a desktop computer, a laptop computer, a tablet computer, a game console, a navigation system, and a digital camera, but the present inventive concept is not limited thereto.

Figure 17:
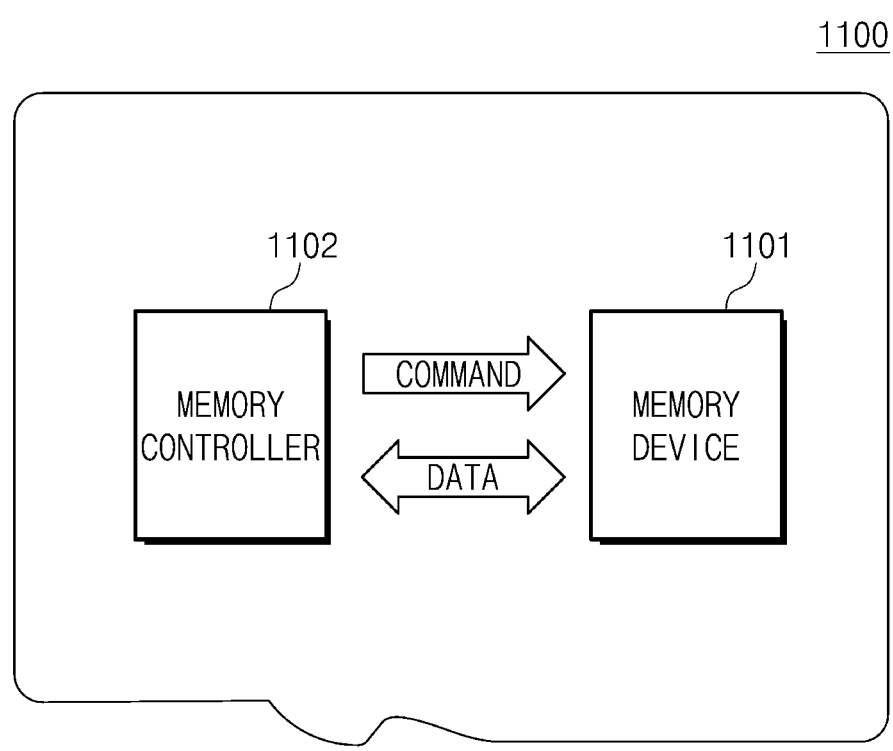
FIG. 17 illustrates a schematic diagram showing a structure of a card-type solid state drive according to exemplary embodiments of the present inventive concept.

FIG. 17 illustrates a schematic diagram showing a structure of a card-type solid state drive according to exemplary embodiments of the present inventive concept.

Referring to FIG. 17, a card-type SSD 1100 may include a nonvolatile memory device 1101 and a memory controller 1102 that are disposed to exchange electrical signals therebetween. In exemplary embodiments of the present inventive concept, when the memory controller 1102 sends a command, the nonvolatile memory device 1101 may transfer data.

The nonvolatile memory device 1101 nay include a memory array or a memory array bank. The card-type SSD 1100 may include one of the card-type SSDs 100, 100A, 100B, 100C, 100D, 100E, 100F, 100G, 100H, 100I, 100J, and 100K that are discussed above according to exemplary embodiments of the present inventive concept.

Figure 18:
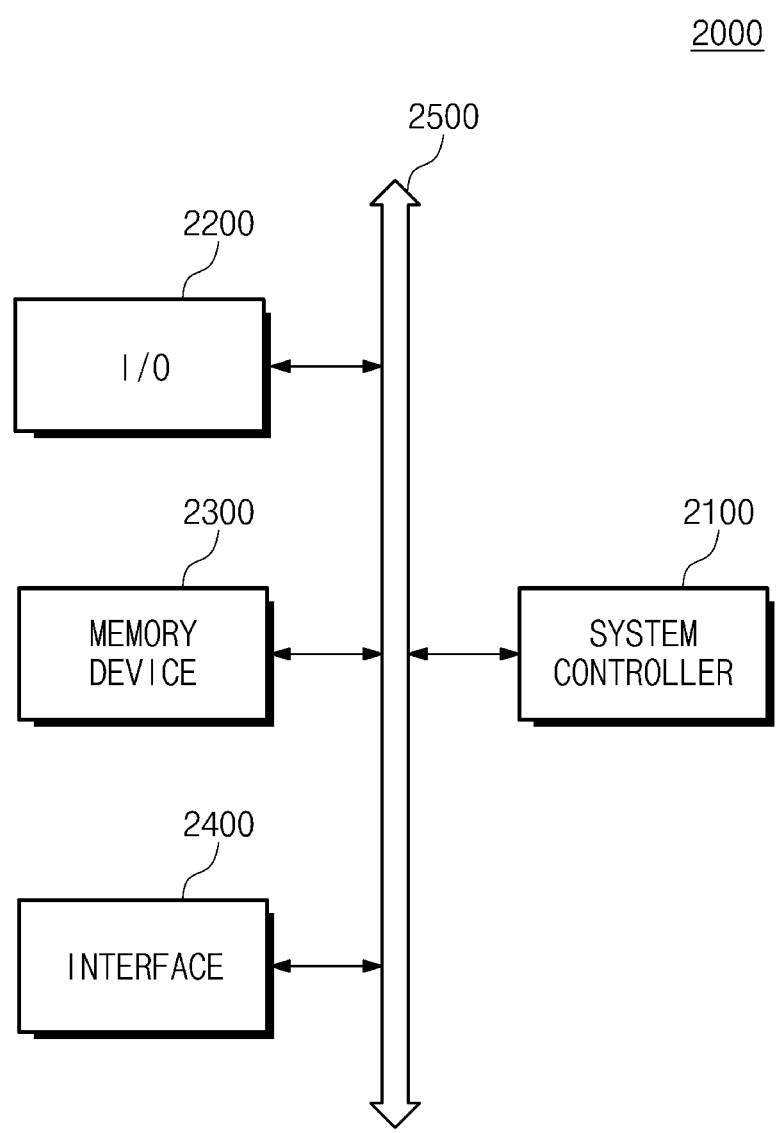
FIG. 18 illustrates a block diagram showing an electronic system including a card-type solid state drive according to exemplary embodiments of the present inventive concept.

FIG. 18 illustrates a block diagram showing an electronic system including a card-type solid state drive according to exemplary embodiment of the present inventive concept.

Referring to FIG. 18, an electronic, system 2000 may include a system controller 2100, an input/output device 2200, a memory device 2300, an interface 2400, and a bus 2500.

The system controller 2100, the input/output device 2200, the memory device 2300, and/or the interface 2400 may be electrically connected to each other through the bus 2500. The bus 2500 may correspond to a data transfer pathway.

The system controller 2100 may include one or more of a microprocessor, a digital signal processor, a microcontroller, and any logic device that performs a similar function thereof.

The input/output device 2200 may include one or more of a keypad, a keyboard, a touchpad, a touch-screen, a display device, a printer, and any device that performs a similar function thereof.

The memory device 2300 may store data and/or commands. The memory device 2300 may include one of the card-type SSDs 100, 100A, 100B 100C, 100D, 100E, 100F, 100G, 100H, 100I, 100J, and 100K that are discussed above according to exemplary embodiments of the present inventive concept. In addition, the memory device 2300 may further include a different type of memory device.

The interface 2400 may communicate data with a communication network. The interface 2400 may be of a wired or wireless type. For example, the interface 2400 may include an antenna, a wired wireless transceiver, or Wi-Fi connection.

The electronic system 2000 may further include a working memory device for improving operation of the system controller 2100. The electronic system 2000 may be applicable to a smart phone, a desktop computer, a laptop computer, a tablet computer, a game console, a navigation system, a digital camera, or any electronic apparatus capable of communicating data in a wired/wireless environment.

According to exemplary embodiments of the present inventive concept, a card-type SSD may include electrical functional terminals and thermal terminals, and thus effectively discharges heat from the card-type SSD. Accordingly, the card-type SSD is prevented from a remarkable increase in temperature during operation even at high speeds, and therefore increases in reliability.

While the present inventive concept has been particularly shown and described with reference to exemplary embodiments thereof, it will be understood that various changes in form and details may be made thereto without departing from the spirit and scope of the present inventive concept as set forth in the following claims.

What is claimed is:

1. A card-type solid state drive (SSD), comprising:
a substrate that has a first surface and a second surface facing each other;
a memory controller and a nonvolatile memory device that are on the first surface;
a plurality of functional terminals on the second surface; and
a plurality of thermal terminals on the second surface,
wherein the functional terminals include first-row functional terminals, second-row functional terminals, and third-row functional terminals,
wherein at least one of the first-row functional terminals, at least one of the second-row functional terminals, and at least one of the third-row functional terminals are electrically connected to the memory controller or the nonvolatile memory device, and
wherein the thermal terminals are not electrically connected to the memory controller or the nonvolatile memory device, and
wherein at least one of the thermal terminals overlaps the memory controller or the nonvolatile memory device.

2. The card-type SSD of claim 1, wherein
the substrate includes an insertion edge, a first edge, and a second edge, the first and second edges being adjacent to the insertion edge and spaced apart from each other,
the first-row functional terminals are spaced apart from the insertion edge, the first-row functional terminals including a first power terminal and a plurality of first data terminals,
the second-rows functional terminals are farther away from the insertion edge than the first-row functional terminals, the second-row functional terminals including a second power terminal and a plurality of second data terminals,
the third-row functional terminals are farther away from the insertion edge than the second-row functional terminals, the third-row functional terminals including a third power terminal and a plurality of command terminals, p1 the first, second, and third power terminals are linearly arranged along the first edge, and
the card-type SSD further comprises a protrusion at the first edge.

3. The card-type SSD of claim 1, wherein the thermal terminals include gold (Au).

4. The card-type SSD of claim 2, wherein the thermal terminals include first-row thermal terminals and second-row thermal terminals,
wherein the first-row thermal terminals are farther away from the insertion edge than the third-row functional terminals,
wherein the second-row thermal terminals are farther away from the insertion edge than the first-row thermal terminals, and
wherein one of the first-row thermal terminals and one of the second-row thermal terminals closest to the first edge are linearly arranged along the first edge and are not linearly aligned with the first, second, or third power terminal.

5. The card-type SSD of claim 2, wherein a size of each of the thermal terminals is less than a size of each of the first, second, and third power terminals.

6. The card-type SSD of claim 2, wherein
the insertion edge extends in a first direction, the first and second edges extend in a second direction perpendicular to the first direction, the thermal terminals have substantially the same first width in the first direction, and the first width is about 0.5 mm to about 0.9 mm.

7. The card-type SSD of claim 2, wherein the first data terminals include a pair of first data input terminals, a pair of first data output terminals, a pair of second data input terminals, and a pair of second data output terminals, and the second data terminals include a pair of third data input terminals, a pair of third data output terminals, a pair of fourth data input terminals, and a pair of fourth data output terminals.

8. The card-type SSD of claim 7, wherein the first-row functional terminals further include a pair of reference clock terminals, wherein the reference clock terminals are between the first power terminal and the first data input terminals.

9. The card-type SSD of claim 4, wherein each of the total number of the first-row thermal terminals and the total number of the second-row thermal terminals is:

less than the total number of the first-row functional terminals, greater than the total number of the second-row functional terminals, and greater than the total number of the third-row functional terminals.

10. A card-type solid state drive (SSD), comprising:

a substrate that includes an insertion edge, a first edge, and a second edge, the insertion edge extending in a first direction, the first and second edges being adjacent to the insertion edge and extending in a second direction perpendicular to the first direction;

a protrusion at the first edge; and first-row functional terminals, second-row functional terminals, third-row functional terminals, and thermal terminals that are on a surface of the substrate, wherein the first-row functional terminals are linearly arranged along the first direction, the first-row functional terminals including a first power terminal and a plurality of first data terminals, wherein the second-row functional terminals are spaced apart in the second direction from the first-row functional terminals and are linearly arranged along the first direction, the second-row functional terminals including a second power terminal and a plurality of second data terminals, wherein the third-row functional terminals are spaced apart in the second direction from the second-row functional terminals and are linearly arranged along the first direction, the third-row functional terminals including a third power terminal and a plurality of command terminals, wherein the thermal terminals are arranged in at least one row and are spaced apart in the second direction from the first-row functional terminals, the second-row functional terminals, and the third-row functional terminals, wherein the first, second, and third power terminals are adjacent to the first edge, and wherein one of the thermal terminals that is adjacent to the first edge is not linearly arranged along the second direction with the first, second, or third power terminal.

11. The card-type SSD of claim 10, wherein a length in the second direction of each of the thermal terminals is less than a length in the second direction of each of the first, second, and third power terminals.

12. The card-type SSD of claim 10, wherein the first, second, and third power terminals are linearly arranged along the second direction, and one of the thermal terminals is spaced apart in the first direction from the first, second, and third power terminals, the one of the thermal terminals being adjacent to the first edge.

13. The card-type SSD of claim 10, wherein the thermal terminals include first-row thermal terminals, second-row thermal terminals, and third-row thermal terminals, wherein the first-row thermal terminals are linearly arranged, along the first direction and are spaced apart in the second direction from the third-row functional terminals, and wherein the second-row thermal terminals are linearly arranged along the first direction and are spaced apart in the second direction from the first-row thermal terminals.

14. The card-type SSD of claim 10, wherein the thermal terminals include first-row thermal terminals, second-row thermal terminals, and third-row thermal terminals, wherein the first-row thermal terminals and the second-row thermal terminals are closer to the insertion edge than the first-row functional terminals.

15. The card-type SSD of claim 10, wherein the thermal terminals include first-row thermal terminals and second-row thermal terminals, wherein the first-row functional terminals, the second-row functional terminals and the third-row functional terminals are disposed between the second-row thermal terminals and the first-row thermal terminals.

16. The card-type SSD of claim 10, wherein the substrate further includes a withdrawal edge that faces the insertion edge, the thermal terminals are farther away in the second direction from the insertion edge than the third-row functional terminals, and a distance between the third-row functional terminals and the thermal terminals is less than a distance between the thermal terminals and the withdrawal edge.

17. A card-type solid state drive (SSD), comprising:

a substrate that has a first surface and a second surface facing each other;

a memory controller and a nonvolatile memory device that are on the first surface;

a plurality of functional terminals on the second surface; and a plurality of thermal terminals on the second surface, wherein the substrate further includes an insertion edge, a first edge, a second edge, and a protrusion at the first edge, the insertion edge extending in a first direction, the first and second edges being adjacent to the insertion edge and extending in a second direction perpendicular to the first direction, wherein the functional terminals include first-row functional terminals including a first power terminal, second-row functional terminals including a second power terminal, and third-row functional terminals including a third power terminal adjacent to a first edge of the card-type SSD, wherein a thermal terminal closest to the first edge is farther from the first edge than each of the first, second and third power terminals, and wherein at least one of the thermal terminals overlaps the memory controller or the nonvolatile memory device.

18. The card-type SSD of claim 17, wherein the first, second and third power terminals are linearly arranged.

19. The card-type SSD of claim 17, wherein the thermal terminals are arranged in a row.

* * * * *